United States Patent
Kim et al.

(10) Patent No.: US 11,594,488 B2
(45) Date of Patent: Feb. 28, 2023

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Byungho Kim, Cheonan-si (KR); Seongjin Shin, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 17/237,223

(22) Filed: Apr. 22, 2021

(65) Prior Publication Data
US 2022/0068814 A1 Mar. 3, 2022

(30) Foreign Application Priority Data
Aug. 27, 2020 (KR) .......................... 10-2020-0108511

(51) Int. Cl.
  *H01L 23/528* (2006.01)
  *H01L 23/522* (2006.01)

(52) U.S. Cl.
  CPC ...... *H01L 23/5286* (2013.01); *H01L 23/5226* (2013.01)

(58) Field of Classification Search
  CPC .................. H01L 23/5286; H01L 23/5226

USPC ........................................................ 257/774
See application file for complete search history.

(56) References Cited

U.S. PATENT DOCUMENTS

| | | | |
|---|---|---|---|
| 3,014,154 | A1 | 9/2011 | Lee |
| 10,186,468 | B2 * | 1/2019 | Pindl ................... H01L 21/2007 |
| 10,211,149 | B2 | 2/2019 | Harr et al. |
| 10,297,519 | B2 | 5/2019 | Lin |
| 10,504,855 | B2 | 12/2019 | Jung et al. |
| 2019/0287924 | A1 | 9/2019 | Moon et al. |
| 2020/0075487 | A1 | 3/2020 | Shin et al. |

FOREIGN PATENT DOCUMENTS

KR  10-1389899 A  4/2014

\* cited by examiner

*Primary Examiner* — Tu-Tu V Ho
(74) *Attorney, Agent, or Firm* — Muir Patent Law, PLLC

(57) ABSTRACT

A semiconductor package includes a substrate, at least one semiconductor chip arranged in the substrate and having chip pads, and a redistribution wiring layer covering a lower surface of the substrate and including first and second redistribution wirings and dummy patterns, the first and second redistribution wirings being stacked in at least two levels and connected to the chip pads. The first and second redistribution wirings are arranged in a redistribution region of the redistribution wiring layer, and the dummy patterns extend in an outer region outside the redistribution region to partially cover corner portions of the redistribution wiring layer, respectively.

20 Claims, 31 Drawing Sheets

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2020-0108511, filed on Aug. 27, 2020 in the Korean Intellectual Property Office (KIPO), the contents of which are herein incorporated by reference in their entirety.

BACKGROUND

1. Field

The present inventive concept relates to a semiconductor package and a method of manufacturing the semiconductor package, more particularly to a fan-out semiconductor package and a method of manufacturing the same.

2. Description of the Related Art

A fan out package having a relatively thin thickness may include a frame, a front redistribution wiring layer provided on a lower surface of the frame, and a backside redistribution wiring layer on an upper surface of the frame. However, due to a difference in coefficient of thermal expansion between individual components of the package, corner portions of a peripheral region of the package that is relatively weak (for example, corner regions within 2 mm to 3 mm from a corner of the peripheral region) may be rolled up when it is heated, thereby causing a smile warpage.

SUMMARY

Example embodiments provide a semiconductor package capable of decreasing a total package thickness and preventing warpage.

Example embodiments provide a method of manufacturing the semiconductor package.

According to an embodiment of the present inventive concept, a semiconductor package includes a substrate with a cavity extending from an upper surface of the substrate to a lower surface of the substrate, at least one semiconductor chip disposed in the cavity of the substrate, and having a plurality of chip pads, and a redistribution wiring layer disposed on the lower surface of the substrate, and including first and second redistribution wirings and a plurality of dummy patterns, the first and second redistribution wirings being stacked in at least two levels and connected to the plurality of chip pads. The redistribution wiring layer includes four outer side surfaces, and the first and second redistribution wirings are arranged in a redistribution region of the redistribution wiring layer. The redistribution region is a region of the redistribution wiring layer defined by four lines extending parallel to the four side surfaces of the redistribution wiring layer to form an outer rectangle of the redistribution region. The plurality of dummy patterns are disposed on an outer region of the redistribution wiring layer outside the redistribution region of the redistribution wiring layer to partially cover a plurality of corner portions of the redistribution wiring layer, respectively. An outermost boundary of a shape created by the outer rectangle of the redistribution region and the plurality of corner portions forms a shape that is not a rectangle.

According to an embodiment of the present inventive concept, a semiconductor package includes a redistribution wiring layer including first and second redistribution wirings stacked in at least two levels and a plurality of extension patterns, at least one semiconductor chip arranged on the redistribution wiring layer, and having a plurality of chip pads electrically connected to the first and second redistribution wirings, and a mold substrate disposed on an upper surface of the redistribution wiring layer and covering the at least one semiconductor chip. The redistribution wiring layer includes four outer side surfaces, and the first and second redistribution wirings which are arranged in a redistribution region of the redistribution wiring layer. The redistribution region is a region of the redistribution wiring layer defined by four lines extending parallel to the four outer side surfaces of the redistribution wiring layer to form a rectangle of the redistribution region. The plurality of extension patterns are disposed on an outer region of the redistribution wiring layer outside the redistribution region of the redistribution wiring layer to partially cover a plurality of corner portions of the redistribution wiring layer, respectively.

According to an embodiment of the present inventive concept, a semiconductor package includes a substrate with a cavity extending from an upper surface of the substrate to a lower surface of the substrate, at least one semiconductor chip disposed in the cavity of the substrate, and having a plurality of chip pads, a redistribution wiring layer disposed on the lower surface of the substrate, and including first and second redistribution wirings and a plurality of dummy patterns, the first and second redistribution wirings being stacked in at least two levels and connected to the plurality of chip pads, and a plurality of outer connection members disposed on an outer surface of the redistribution wiring layer and electrically connected to the first and second redistribution wirings. The redistribution wiring layer includes four outer side surfaces, and the first and second redistribution wirings are arranged in a redistribution region of the redistribution wiring layer. The redistribution region is a region of the redistribution wiring layer defined by four lines extending parallel to the four outer side surfaces of the redistribution wiring layer to form a rectangle of the redistribution region. The plurality of dummy patterns are disposed at an outer region of the redistribution wiring layer outside the redistribution region of the redistribution wiring layer to partially cover a plurality of corner portions of the redistribution wiring layer, respectively. A portion of the plurality of outer connection members is disposed on a first region of the redistribution region, the first region of the redistribution region being between the plurality of dummy patterns and the at least one semiconductor chip.

According to example embodiments, a semiconductor package as a fan-out package may include a core substrate provided in a region outside a semiconductor chip and a lower redistribution wiring layer covering a lower surface of the core substrate. The semiconductor package may include first dummy patterns extending in a first outer region of the core substrate in which metal wirings are not formed, to cover corner portions thereof. Additionally, the semiconductor package may include second dummy patterns extending in a second outer region of the redistribution wiring layer in which redistribution wirings are not formed, to cover corner portions thereof.

Accordingly, the first and second dummy patterns may be provided in the corner portions in a peripheral region of the semiconductor package to relatively increase coefficient of thermal expansion in the corner portions. Thus, the first and second dummy patterns may serve as reinforcing patterns to prevent a bending phenomenon in which the corner portions are rolled upward in a high temperature range.

BRIEF DESCRIPTION OF THE DRAWINGS

Example embodiments will be more clearly understood from the following detailed description taken in conjunction with the accompanying drawings. FIGS. 1 to 30 represent non-limiting, example embodiments as described herein.

FIG. 1 is a cross-sectional view illustrating a semiconductor package in accordance with example embodiments.

FIG. 2 is a plan view illustrating the semiconductor package in FIG. 1.

FIG. 3 is a plan view illustrating a portion of a first wiring layer of a core substrate in FIG. 1.

FIG. 4 is an enlarged plan view illustrating a first dummy pattern in FIG. 3.

FIG. 6 is an enlarged plan view illustrating a third dummy pattern in FIG. 5.

FIGS. 7 to 20 are cross-sectional views illustrating a method of manufacturing a semiconductor package in accordance with example embodiments.

FIG. 21 is a cross-sectional view illustrating a semiconductor package in accordance with example embodiments.

FIG. 22 is a plan view illustrating the semiconductor package in FIG. 21.

FIG. 23 is a plan view illustrating a portion of a first redistribution wiring layer of a redistribution wiring layer in FIG. 21.

FIGS. 24 to 28 are cross-sectional views illustrating a method of manufacturing a semiconductor package in accordance with example embodiments.

FIG. 29 is a cross-sectional view illustrating a semiconductor package in accordance with example embodiments.

FIG. 30 is a cross-sectional view illustrating a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
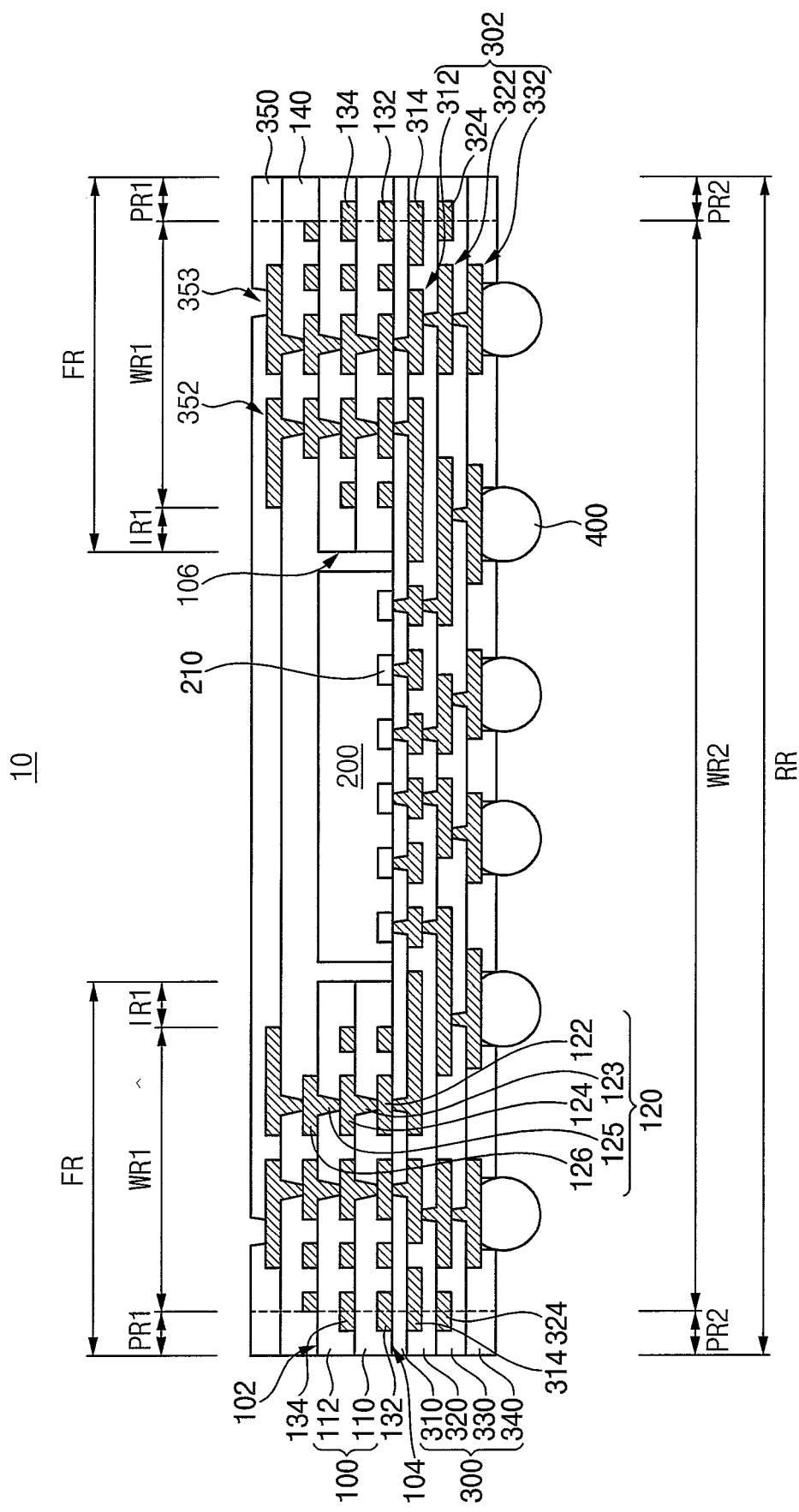
Figure 2:
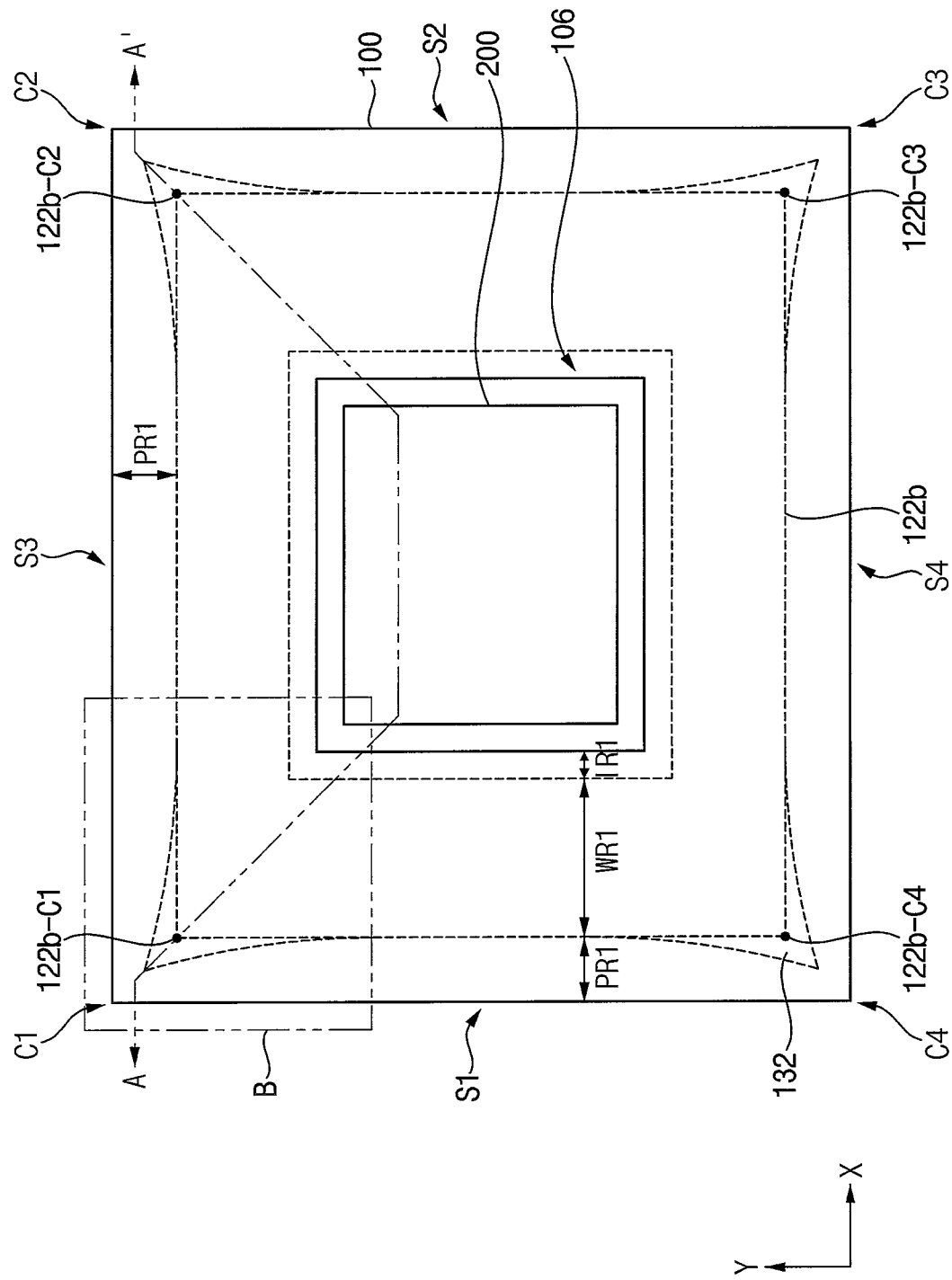
Figure 3:
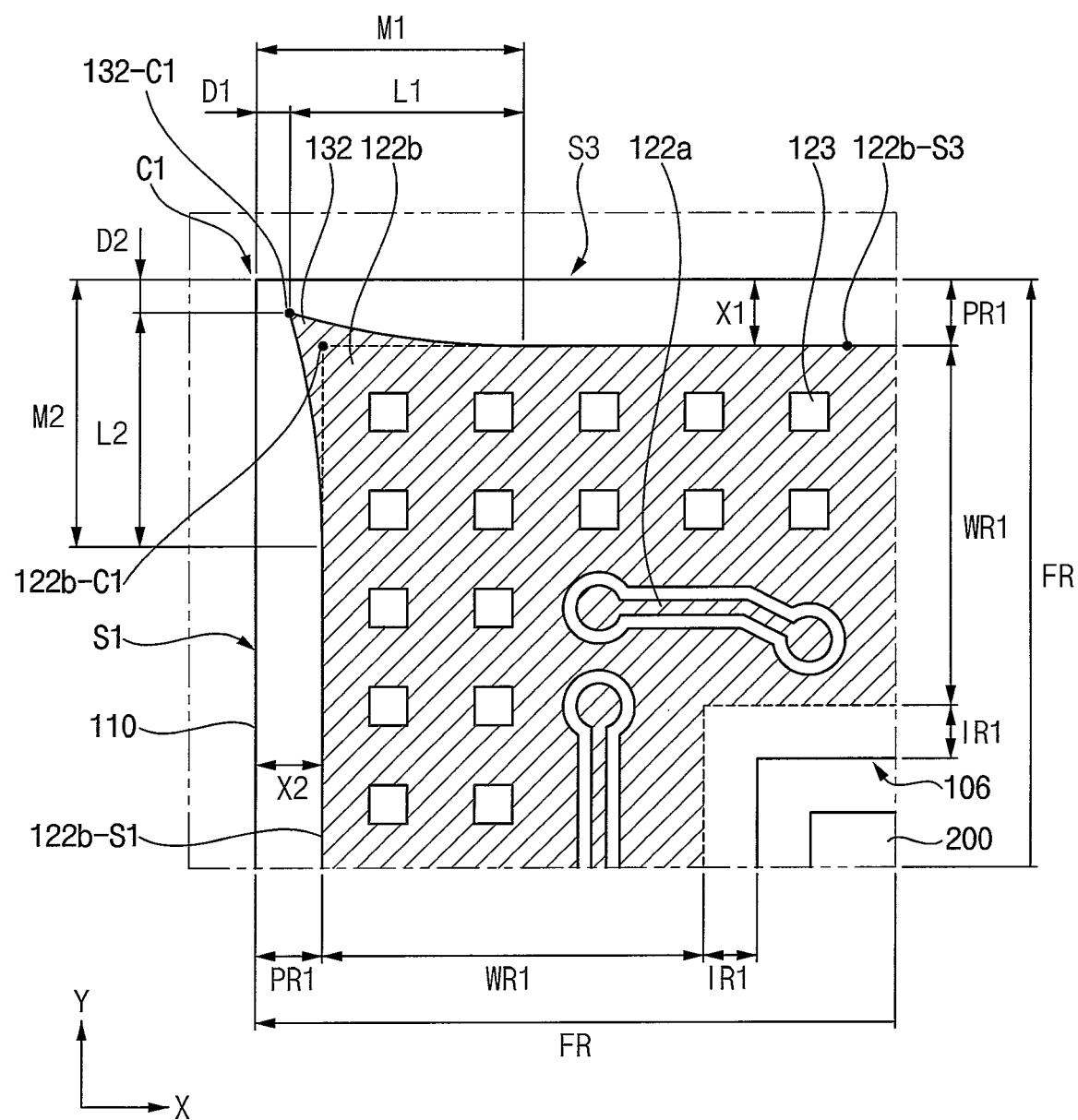
Figure 4:
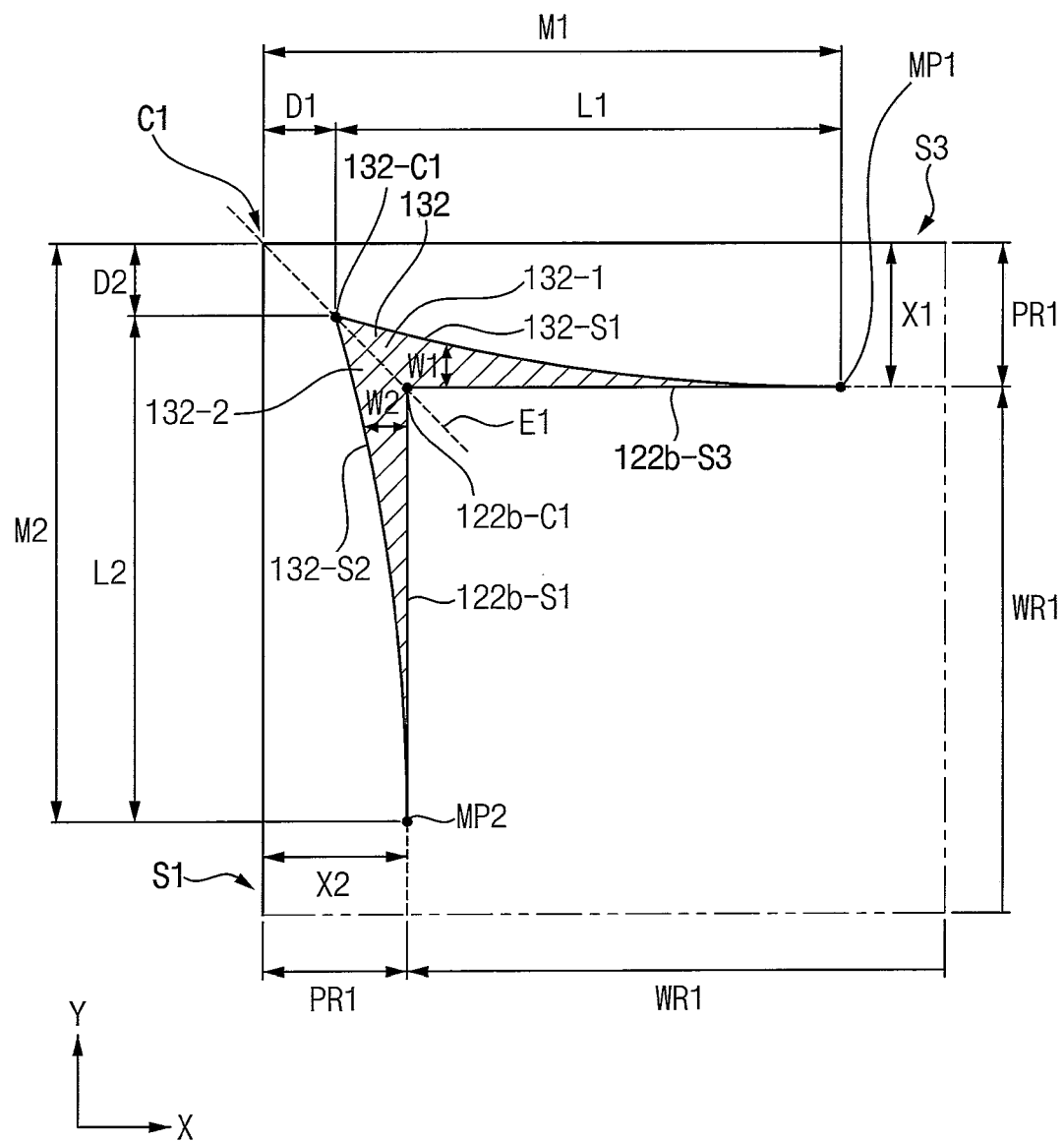
Figure 5A:
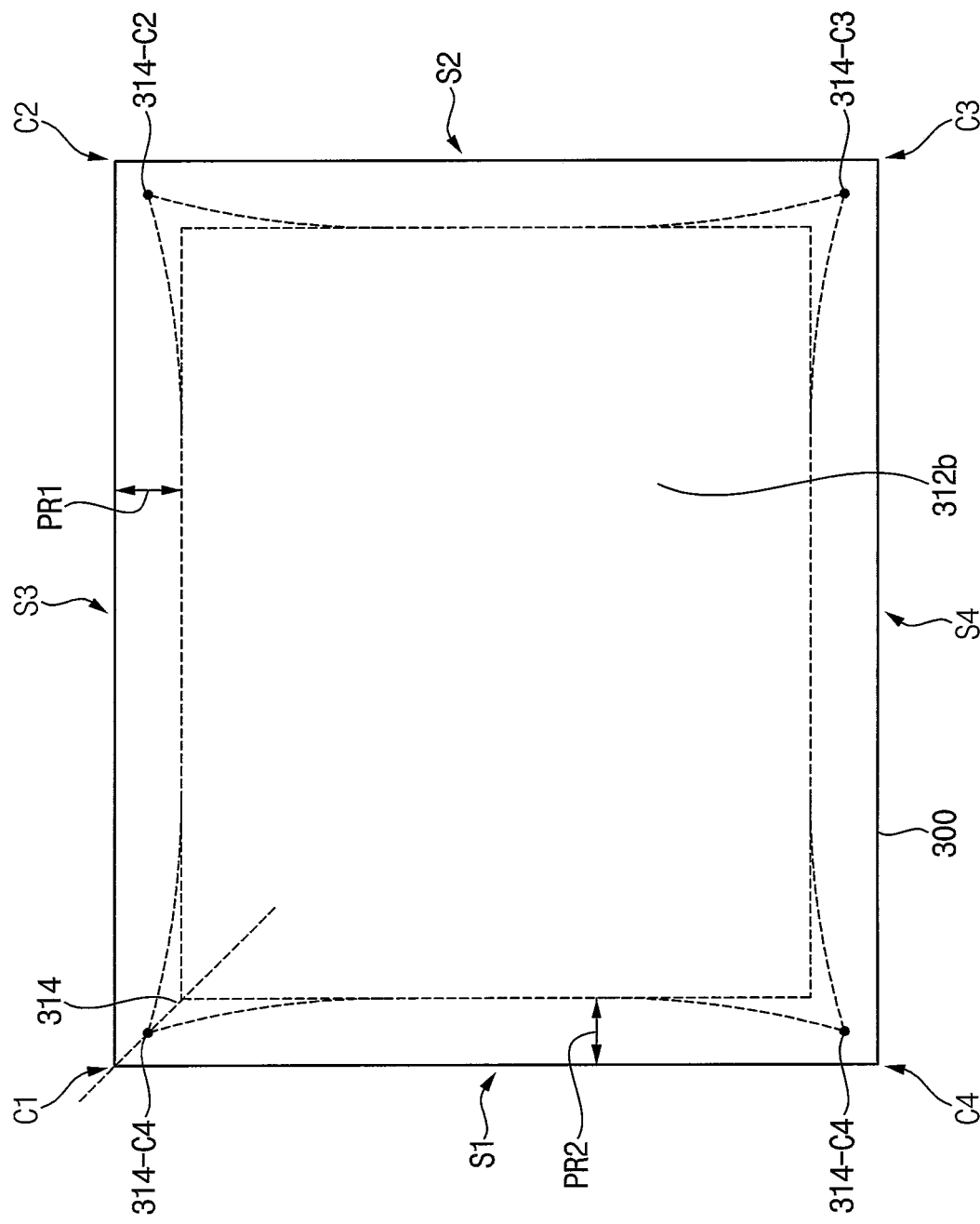
FIG. 5A is a plan view illustrating a first redistribution wiring layer of a redistribution wiring layer in FIG. 1.
Figure 5B:
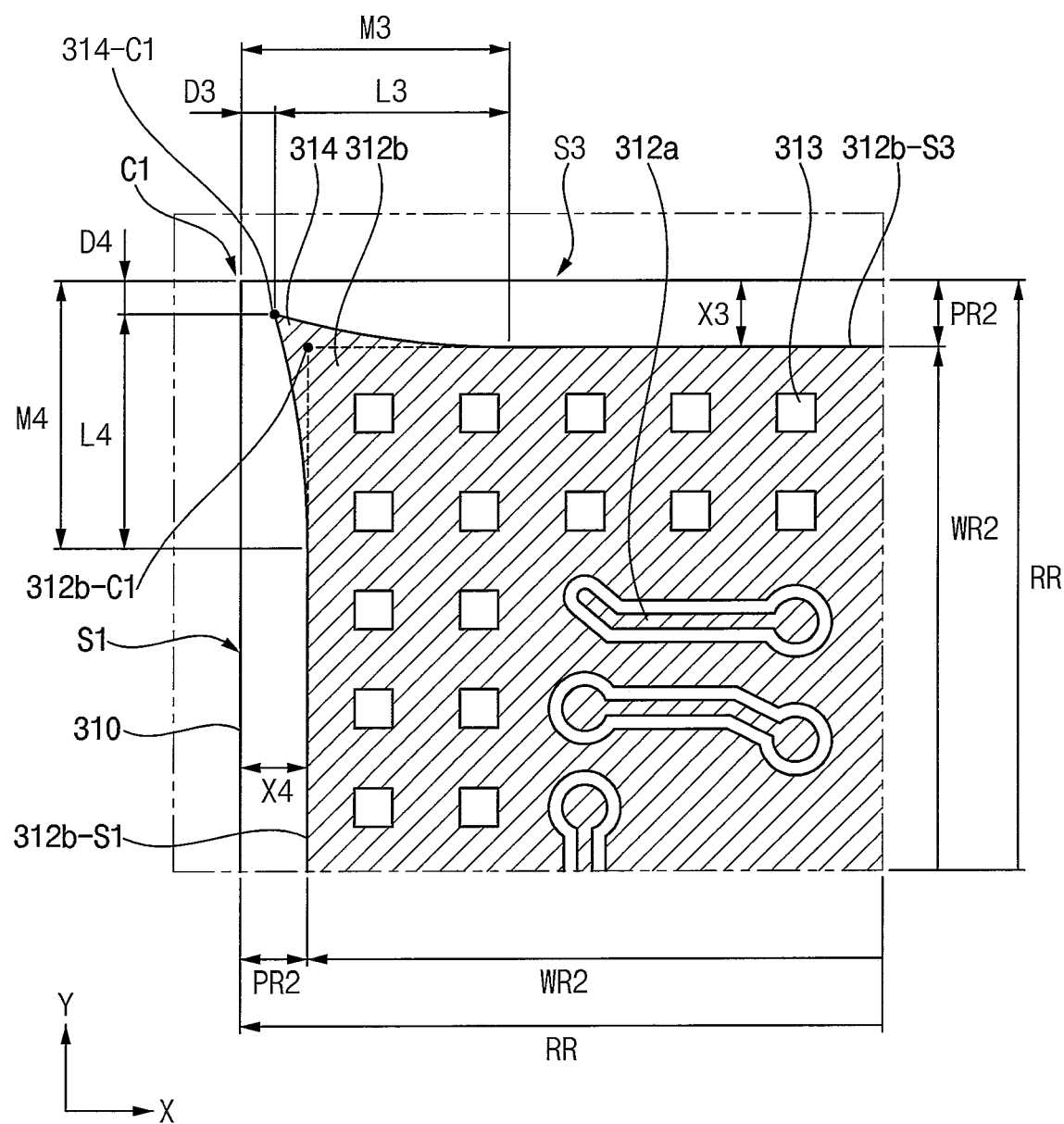
FIG. 5B is a plan view illustrating a portion of a first redistribution wiring layer of a redistribution wiring layer in FIG. 1.
Figure 6:
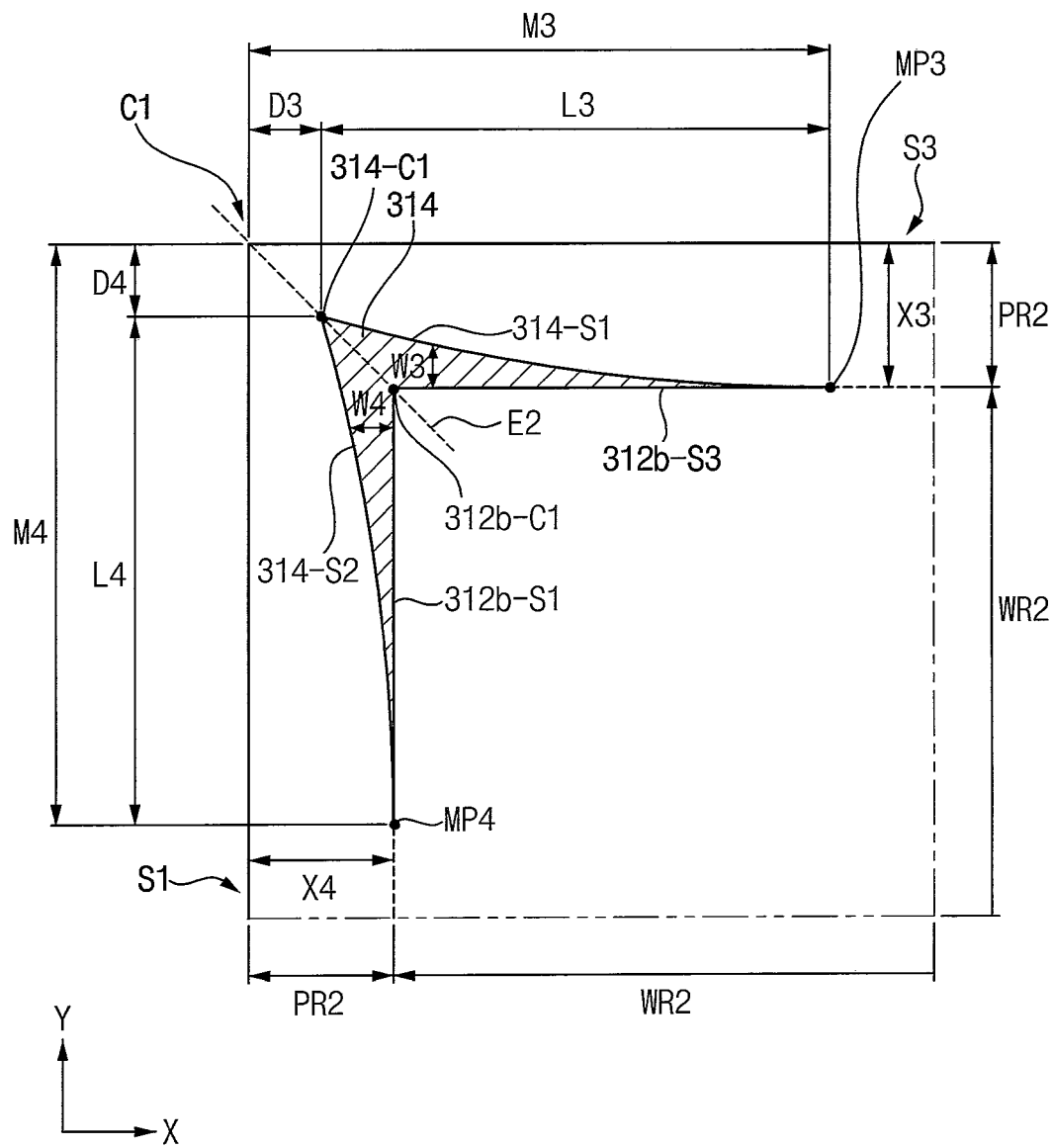

FIG. 1 is a cross-sectional view illustrating a semiconductor package in accordance with example embodiments. FIG. 2 is a plan view illustrating the semiconductor package in FIG. 1. FIG. 3 is a plan view illustrating a portion of a first wiring layer of a core substrate in FIG. 1. FIG. 4 is an enlarged plan view illustrating a first dummy pattern in FIG. 3. FIG. 5A is a plan view illustrating a first redistribution wiring layer in FIG. 1. FIG. 5B is a plan view illustrating a portion of a first redistribution wiring layer of a redistribution wiring layer in FIG. 1. FIG. 6 is an enlarged plan view illustrating a third dummy pattern in FIG. 5A. FIG. 1 is a cross-sectional view taken along the line A-A' in FIG. 2. FIGS. 3 and 5 are plan views illustrating portion 'B' in FIG. 2.

Referring to FIGS. 1 to 6, a semiconductor package 10 may include a core substrate 100 with a cavity 106, at least one semiconductor chip 200 arranged in the cavity 106 of the core substrate 100, and a redistribution wiring layer 300 on a lower surface 104 of the core substrate 100. The semiconductor package 10 may further include a backside redistribution wiring layer provided on an upper surface 102 of the core substrate 100 and outer connection members 400 provided on an outer surface of the redistribution wiring layer 300.

In example embodiments, the semiconductor package 10 may include the core substrate 100 provided as a base substrate which surrounds the semiconductor chip 200. The core substrate 100 may include core connection wirings 120 which are provided in a fan out region outside an area where the semiconductor chip 200 is arranged. The core connection wirings 120 may function as an electrical connection path for the semiconductor chip 200. Accordingly, the semiconductor package 10 may be provided as a fan-out package. In an embodiment, the semiconductor package 10 may be provided as a unit package on which a second package is stacked.

The semiconductor package 10 may be a System-In-Package (SIP). For example, one or more semiconductor chip may be arranged in the core substrate 100. A logic chip including logic circuits and/or a memory chip may be disposed in the cavity 106 of the core substrate 100. The logic chip may be a controller to control the memory chip. The memory chip may include various memory circuits such as dynamic random access memory (DRAM), static random access memory (SRAM), flash memory, phase-change random access memory (PRAM), resistive random access memory (ReRAM), ferroelectric random access memory (FeRAM), magneto-resistive random access memory (MRAM), or the like.

In example embodiments, the core substrate 100 may have the first surface (upper surface) 102 and the second surface (lower surface) 104 opposite to each other. The core substrate 100 may have the cavity 106 in the middle region thereof. The cavity 106 may extend from the first surface 102 of the core substrate 100 to the second surface 104 of the core substrate 100.

As illustrated in FIG. 2, the semiconductor package 10 may include a first side surface S1 and a second side surface S2 extending in a second direction (Y direction) and being spaced apart from each other in a first direction (X direction) different from the second direction, and a third side surface S3 and a fourth side surface S4 extending in the first direction and being spaced apart from each other in the second direction. The semiconductor package 10, when viewed in a plan view, may have a rectangular shape. The semiconductor package may include four corners C1, C2, C3, and C4, which correspond to four corners of the core substrate 100. Hereinafter, the references C1, C2, C3, and C4 also indicate the four corners of the core substrate 100. Outer surfaces of the core substrate 100 and outer surfaces of the redistribution wiring layer 300 corresponding thereto may constitute the first to four side surfaces S1, S2, S3, and S4 of the semiconductor package 10. The first to four side surface S1, S2, S3, and S4 of the semiconductor package 10 may correspond to four outer side surfaces of the core substrate 100, and to four outer side surfaces of the redistribution wiring layer 300. Hereinafter, the references S1, S2, S3, and S4 also indicate the four outer side surfaces of each of the core substrate 100 and the redistribution wiring layer 300.

The core substrate 100 may include a frame region FR defined by the perimeter of the cavity 106 and the four outer side surfaces S1, S2, S3, and S4 of the core substrate 100. For example, the frame region FR may be a region of the core substrate between the perimeter of the cavity 106 and the four outer side surfaces S1, S2, S3, and S4 of the core substrate 100. The frame region FR may include a first wiring region WR1, a first outer region PR1 outside the first wiring region WR1 and a first inner region IR1 inside the first wiring region WR1.

In example embodiments, the core substrate 100 may include a plurality of stacked insulation layers 110 and 112 and core connection wirings 120 provided in the insulation layers. A plurality of the core connection wirings 120 may be provided in the fan out region outside an area where the semiconductor chip (die) 200 is disposed, to be used for electrical connection with the semiconductor chip 200.

For example, the core substrate 100 may include a first insulation layer 110 and a second insulation layer 112 stacked on the first insulation layer 110. The core connection wiring 120 may include a first metal wiring 122, a first contact 123, a second metal wiring 124, a second contact 125 and a third metal wiring 126. The first metal wiring 122 may be provided on the second surface 104 of the core substrate 100, which corresponds to a lower surface of the first insulation layer 110. In an embodiment, the first metal wiring 122 may be buried in the first insulation layer 110, and at least a portion of the first metal wiring 122 may be exposed from the second surface 104. The third metal wiring 126 may be provided on the first surface 102 of the core substrate 100, which corresponds to an upper surface of the second insulation layer 112. In an embodiment, at least a portion of the third metal wiring 126 may be disposed on the first surface 102, and may be exposed from the first surface 102. The numbers and arrangements of the insulation layers and the core connection wirings are not limited thereto. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

In example embodiments, the core substrate 100 may include at least two stacked wiring layers. The core substrate 100 may include a dummy pattern provided in the at least one wiring layer. The dummy pattern may be arranged in the first outer region PR1. When the semiconductor package 10 has four first to fourth corners C1, C2, C3, and C4, four first dummy patterns 132 may extend from four corners 122b-C1 to 122b-C4 of a first ground pattern 122b toward the four corners C1, C2, C3, and C4 of the core substrate 100, respectively. The first dummy patterns 132 may be extended corner portions of a first ground pattern 122b toward the four corners C1, C2, C3 and C4 of the core substrate 100, respectively. The various dummy patterns discussed herein may also be described as "extension patterns."

For example, the core substrate 100 may include first to third wiring layers in three levels. The first wiring layer of the core connection wiring 120 may include the first metal wiring 122 arranged in the first wiring region WR1 and the first dummy pattern 132 in the first outer region PR1. The second wiring layer of the core connection wiring 120 may include the second metal wiring 124 arranged in the first wiring region WR1 and a second dummy pattern 134 in the first outer region PR1. The third wiring layer of the core connection wiring 120 may include the third metal wiring 126 arranged in the first wiring region WR1. Accordingly, the dummy patterns may be provided in the first and second wiring layers of the first to third wiring layers of the core substrate 100, respectively. The first dummy pattern 132 may be formed on the same plane (e.g., a first lower insulation layer 310) as the first metal wiring 122. In an embodiment, the first dummy pattern 132 may be formed in the same level as the first metal wiring 122. The second dummy pattern 134 may be formed on the same plane (e.g., the first insulation layer 110) as the second metal wiring 124. In an embodiment, the second dummy pattern 134 may be formed in the same level as the second metal wiring 124.

As illustrated in FIGS. 3 and 4, the first metal wiring 122 may include a first signal pattern 122a and a first ground pattern 122b. For the simplicity of description, FIGS. 3 and 4 show a corner portion adjacent to the first corner C1 of the core substrate 100, and the description thereof is provided below. Similar descriptions will apply to the other corner portions adjacent to the corners C2, C3, and C4 of the core substrate 100. In an embodiment, the first ground pattern 122b may be electrically grounded, and the first signal pattern 122a may be part of a signal path connected to the semiconductor chip 200. The first dummy patterns 132, which correspond to extended corner portions of the first ground pattern 122b, may be grounded, and suppress corner warpage of the core substrate 100. The first metal wiring 122 may further include a first power pattern (not illustrated). The first ground pattern 122b may include a metal pattern having a plurality of through holes 123H. For example, the metal pattern may include a metal material such as copper (Cu). The through hole may have a cylindrical or polygonal column shape.

The first signal pattern 122a, the first ground pattern 122b and the first power pattern may be arranged in the first wiring region WR1. The first dummy pattern 132 may be disposed in the first outer region PR1, and may extend from a first corner 122b-C1 of the first ground pattern 122b toward the first corner C1 of the core substrate 100 to cover at least a portion of the core substrate 100, which is between the first corner C1 of the core substrate 100 and the first corner 122b-C1 of the first ground pattern 122b. In an embodiment, the first dummy pattern 132 may extend along a first extension line E1 on which the first corner 122b-C1 of the first ground pattern 122b and the first corner 132-C1 of the first dummy pattern 132 are disposed. In an embodiment, the first corner C1 of the core substrate 100 may also be disposed on the first extension line E1. The present inventive concept is not limited thereto. In an embodiment, the first corner C1 of the core substrate 100 is not disposed on the first extension line E, and the first extension line E1 intersects one of the outer surfaces S1 and S3 connected to the first corner C1 of the core substrate 100. The first dummy pattern 132 may be provided integrally with the first ground pattern 122b. Accordingly, the first dummy pattern 132 may include the same metal material (e.g., copper (Cu)) as the first ground pattern 122b. A thickness of the first dummy pattern 132 may be the same as a thickness of the first ground pattern 122b. For example, the thickness of the first dummy pattern 132 may have a value from about 3 μm to about 6 Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first outer region PR1 of the frame region FR (i.e., the core substrate 100) may have a first width X1 in a second direction (Y direction) and a second width X2 in a first direction (X direction). The first outer region PR1 may be a region of the frame region FR between the outer boundary of the core substrate 100 (i.e., the outer side surfaces S1 to S4, of the core substrate 100) and the outer boundary of the first ground pattern 122b (i.e., the outer side surfaces 122b-S1 to 122b-S4 of the first ground pattern 122b). The first width X1 and the second width X2 may be the same as or different from each other. For example, the first and second widths X1 and X2 of the first outer region PR1 may have a value from 100 μm to 200 μm. In an embodiment, the first and second widths X1 and X2 of the first outer region PR1 may have the same value of 150 μm.

The first dummy pattern 132 may include a first portion 132-1 and a second portion 132-2. The first portion 132-1 may be a region defined by a first side surface 132-S1 of the first dummy pattern 132, the third side surface 122b-S3 of the first ground pattern 122b, and the first extension line E1. The second portion 132-2 may be a region defined by a second side surface 132-S2 of the first dummy pattern 132, the first side surface 122b-S1 of the first ground pattern 122b, and the first extension line E1. The first portion 132-1 may extend, in the first direction (X direction), away from the first corner 132-C1 of the first dummy pattern 132 by a first length L1. As the first side surface 132-S1 of the first portion 132-1 extends away from the first corner 132-C1 of the first dummy pattern 132 in the first direction (X direction), the first side surface 132-S1 of the first portion 132-1 is closer to the third side surface 122b-S3 of the first ground pattern 122b to be merged therewith at a first merge point MP1. A distance, in the first direction, between the first corner 132-C1 of the first dummy pattern 132 and the first merge point MP1 may be the first length L1. The second portion 132-2 may extend, in the second direction (Y direction), away from the first corner 132-C1 of the first dummy pattern 132 by a second length L2. As the second side surface 132-S2 of the second portion 132-2 extends away from the first corner 132-C1 of the first dummy pattern 132 in the second direction (Y direction), the second side surface 132-S2 of the second portion 132-2 is closer to the first side surface 122b-S1 of the first ground pattern 122b to be merged therewith at a second merge point MP2. A distance, in the second direction, between the first corner 132-C1 of the first dummy pattern 132 and the second merge point MP2 may be the second length L2. For example, the first and second lengths L1 and L2 may be the same as or different from each other. In an embodiment, the first and second lengths L1 and L2 may have the same value from about 1.4 mm to about 2.9 mm.

A width W1 of the first portion (a width in Y direction) may gradually increase from the first merge point MP1 toward the first corner 132-C1 of the first dummy pattern 132, and beyond the first corner 122b-C1 of the first ground pattern 122b, may gradually decrease toward the first corner 132-C1 of the first ground pattern 122b. A width W2 of the second portion (a width in X direction) may gradually increase from the second merge point MP2 toward the first corner 132-C1 of the first dummy pattern 132, and beyond the first corner 122b-C1 of the first ground pattern 122b, gradually decrease toward the first corner 132-C1 of the first ground pattern 122b. The width W1 of the first portion and the width W2 of the second portion may increase linearly or non-linearly toward the first corner 132-C1 of the first dummy pattern 132.

A distance, in the first direction, between the first corner C1 of the core substrate 100 and the first merge point MP1 where the first side surface 132-S1 of the first dummy pattern 132 and the third side surface 122b-S3 of the first ground pattern 122b meet with each other may be a first distance M1. A distance, in the second direction, between the first corner C1 of the core substrate 100 and the second merge point MP2 where the second side surface 132-S2 of the first dummy pattern 132 and the first side surface 122b-S1 of the first ground pattern 122b meet with each other may be a second distance M2. The first and second distances MA and M2 may be same as or different from each other. For example, the first and second distances M1 and M2 may have a value from about 1.5 mm to about 3 mm. In an embodiment, the first and second distances M1 and M2 may have the same value of about 2 mm.

The first dummy pattern 132 may be spaced apart from the outer surface of the core substrate 100. For example, the shortest distance, in the first direction, between the first dummy pattern 132 (i.e., the first corner 132-C1 of the first dummy pattern 132) and the first side surface S1 of the core substrate 100 may be a first distance D1, and the shortest distance, in the second direction, between the first dummy pattern 132 (i.e., the first corner 132-C1 of the first dummy pattern 132) and the third side surface S3 of the core substrate 100 may be a first distance D2. The first and second distances D1 and D2 may be the same as or different from each other. For example, the first and second distances D1 and D2 may have a value from about 30 μm to about 90 μm. In an embodiment, the first and second distances D1 and D2 have the same value of about 75 μm.

In an embodiment, the second metal wiring 124 may have a configuration similar to that of the first metal wiring 122. The second metal wiring 124 may include a second signal pattern and a second ground pattern. The second metal wiring 124 may further include a second power pattern. The second ground pattern may include a metal pattern having a plurality of through holes. For example, the metal pattern may include a metal material such as copper (Cu). The through hole may have a cylindrical or polygonal column shape.

The second signal pattern, the second ground pattern and the second power pattern may be arranged in the first wiring region WR1. The second dummy pattern 134, which has a similar configuration of the first dummy pattern 132, may correspond to an extended corner portion of the second ground pattern, and may be disposed in the first outer region PR1 to cover at least a portion of the corner portion adjacent to the first corner C1 of the core substrate 100. Four second dummy patterns 134 may extend to cover at least portions of four corner portions adjacent to the four corners C1, C2, C3, and C4 of the core substrate 100, respectively. The second dummy pattern 134 may be provided integrally with the second ground pattern. The second dummy pattern 134 may include the same metal material (e.g., copper (Cu)) as the second ground pattern. A thickness of the second dummy pattern 134 may be the same as a thickness of the second ground pattern.

The second dummy pattern 134 may have substantially the same or similar dimensions as the first dummy pattern 132. Therefore, descriptions of the second dummy pattern will be omitted. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In example embodiments, the semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

The semiconductor chip 200 may include a substrate and chip pads 210 on an active surface, which is a first surface of the substrate. In an embodiment, transistors of the semiconductor chip 200 may be formed in a region adjacent to the active surface of the substrate. The semiconductor chip 200 may be arranged such that the first surface on which the chip pads 210 are formed faces downward, and the chip pads 210 may be disposed on the second surface 104 of the core substrate 100. The first surface of the semiconductor chip 200 may be coplanar with the second surface 104 of the core substrate 100. A second surface opposite to the first surface of the semiconductor chip 200 may be at the same level as or different from the first surface 102 of the core substrate 100.

A mold layer 140 may be provided on the first surface 102 of the core substrate 100 to cover the semiconductor chip 200. The mold layer 140 may be formed to fill the gap between the sidewall of the semiconductor chip 200 and the inner sidewall of the cavity 106. Accordingly, the mold layer 140 may cover the second surface of the semiconductor chip 200, the first surface 102 of the core substrate 100 and the inner sidewall of the cavity 106.

For example, the mold layer 140 may include an insulation material such as epoxy resin (thermoset dielectric material), a photo imagable dielectric (PID) material, an insulation film such as ABF (Ajinomoto Build-up Film), etc.

In example embodiments, a redistribution wiring layer 300 may be arranged on the second surface 104 of the core substrate 100 and the first surface of the semiconductor chip 200. The redistribution wiring layer 300 may include redistribution wirings 302 electrically connected to the chip pads 210 of the semiconductor chip 200 and the core connection wirings 120 of the core substrate 100. The redistribution wirings 302 may be provided on the second surface 104 of the core substrate 100 to function as a front side redistribution wiring. The redistribution wiring layer 300 may be a front redistribution wiring layer of a fan out package.

The redistribution wiring layer 300 may include a redistribution region RR. The redistribution region RR may include a second wiring region WR2 and a second outer region PR2 outside the second wiring region WR2.

In particular, the redistribution wiring layer 300 may include a first redistribution wiring layer provided on a first lower insulation layer 310 and having first redistribution wirings 312 arranged in the second wiring region WR2 and a third dummy pattern 314 arranged in the second outer region PR2.

The first lower insulation layer 310 may be provided on the second surface 104 of the core substrate 100 and may have first openings that expose the chip pads 210 of the semiconductor chip 200 and the first metal wirings 122 of the core connection wiring 120, respectively. The first redistribution wirings 312 may be provided on the first lower insulation layer 310, and portions of the first redistribution wirings 312 may contact the chip pads 210 and the first metal wirings 122 through the first openings, respectively. The third dummy pattern 314 may be formed on the same plane (e.g., the first lower insulation layer 310) as the first redistribution wiring 312. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The redistribution wiring layer 300 may include a second redistribution wiring layer provided on a second lower insulation layer 320 and having second redistribution wirings 322 arranged in the second wiring region WR2 and a fourth dummy pattern 324 arranged in the second outer region PR2.

The second lower insulation layer 320 may be provided on the first lower insulation layer 310 and may have second openings that expose the first redistribution wirings 312, respectively. The second redistribution wirings 322 may be provided on the second lower insulation layer 320, and portions of the second redistribution wirings 322 may contact the first redistribution wirings 312 through the second openings, respectively. The fourth dummy pattern 324 may be formed on the same plane (e.g., the second lower insulation layer 320) as the second redistribution wiring 322. In an embodiment, the fourth dummy pattern 324 may be formed in the same level as the second redistribution wiring 322.

The redistribution wiring layer 300 may include a third redistribution wiring layer provided on a third lower insulation layer 330 and having third redistribution wirings 332 arranged in the second wiring region WR2.

The third lower insulation layer 330 may be provided on the second lower insulation layer 320 and may have third openings that expose the second redistribution wirings 322, respectively. The third redistribution wirings 332 may be provided on the third lower insulation layer 330 and portions of the third redistribution wirings 332 may contact the second redistribution wirings 322 through the third openings, respectively.

The redistribution wiring layer 300 may include a fourth lower insulation layer 340 provided on the third lower insulation layer 330 to expose portions of the third redistribution wirings 332. The fourth lower insulation layer 340 may serve as a passivation layer. A bump pad (not illustrated) such as UBM (Under Bump Metallurgy) may be provided on the portion of the third redistribution wiring 332 exposed by the fourth lower insulation layer 340. The exposed portion of the third redistribution wiring 332 may serve as a landing pad, that is, a package pad.

As illustrated in FIGS. 5A, 5B, and 6, the first redistribution wiring 312 may include a third signal pattern 312a and a third ground pattern 312b. For simplicity of description, FIGS. 5B and 6 show a corner portion adjacent to the first corner C1 of the redistribution wiring layer 300, and the description thereof is provided below. Similar descriptions will apply to the other corner portions adjacent to the corners C2, C3, and C4 of the redistribution wiring layer 300. In an embodiment, the third ground pattern 312b may be electrically grounded, and the third signal pattern 312a may be part of a signal path connected to the semiconductor chip 200. The third ground patterns 312b, which correspond to extended corner portions of the third ground pattern 312b, may be grounded, and suppress corner warpage of the redistribution wiring layer 300. The first redistribution wiring 312 may further include a third power pattern (not illustrated). The third ground pattern 312b may include a metal pattern having a plurality of through holes 313. For example, the metal pattern may include a metal material such as copper (Cu). The through hole may have a cylindrical or polygonal column shape.

The third signal pattern 312a, the third ground pattern 312b and the third power pattern may be arranged in the second wiring region WR2. The third dummy pattern 314 may be disposed in the second outer region PR2, and may extend from a first corner 312b-C1 of the third ground pattern 312b toward the first corner C1 of the redistribution wiring layer 300 to cover at least a corner portion of the redistribution wiring layer 300, which is between the first corner C1 of the redistribution wiring layer 300 and the first corner 312b-C1 of the third ground pattern 312b. In an embodiment, the third dummy pattern 314 may extend along a second extension line E2 on which the first corner 312b-C1 of the third ground pattern 312b and the first corner 314-C1 of the third dummy pattern 314 are disposed. In an embodiment, the first corner C1 of the redistribution wiring layer 300 may also be disposed on the second extension line E2. The present inventive concept is not limited thereto. In an embodiment, the first corner C1 of the redistribution wiring layer 300 is not disposed on the second extension line E2, and the second extension line E2 intersects one of the outer surfaces S1 and S3 connected to the first corner C1 of the redistribution wiring layer 300. The third dummy patterns 314 may be similarly arranged adjacent to the other corners C2, C3, and C4 of the redistribution wiring layer 300, and for the simplicity of description, the descriptions of the dummy patterns adjacent to the corners C2, C3, and C4 of the redistribution wiring layer 300 may be omitted. The third dummy pattern 314 may include the same metal material (e.g., copper (Cu)) as the third ground pattern 312b. A thickness of the third dummy pattern 314 may be the same as a thickness of the third ground pattern 312b. For example, the thickness of the third dummy pattern 314 may have a value from about 3 μm to about 6 μm.

The second outer region PR2 may have a third width X3 in the second direction (Y direction), and a fourth width X4 in the first direction (X direction). The first second outer region PR2 may be a region of the redistribution region RR between the outer boundary of the redistribution wiring layer 300 (i.e., the outer side surfaces S1 to S4, of the redistribution wiring layer 300) and the outer boundary of the third ground pattern 312b (i.e., the outer side surfaces 312b-S1 to 312b-S4 of the third ground pattern 312b). The third width X3 and the fourth width X4 may be the same as or different from each other. For example, the third and fourth widths X3 and X4 of the second outer region PR2 may have a value from 100 μm to 200 μm. In an embodiment, the third and fourth widths X3 and X4 of the second outer region PR2 have a value of 150 μm.

The third dummy pattern 314 may include a third portion 314-1 and a fourth portion 314-2. The third portion 314-1 may be a region defined by a first side surface 314-S1 of the third dummy pattern 314, the third side surface 312b-S3 of the third ground pattern 312b, and the second extension line E2. The fourth portion 314-2 may be a region defined by a second side surface 314-S2 of the third dummy pattern 314, the first side surface 312b-S1 of the third ground pattern 312b, and the second extension line E2. The third portion 314-1 may extend, in the first direction (X direction), away from the first corner 314-C1 of the third dummy pattern 314 by a third length L3. As the first side surface 314-S1 of the third portion 314-1 extends away from the first corner 314-C1 of the third dummy pattern 314 in the first direction (X direction), the first side surface 314-S1 of the third portion 314-1 is closer to the third side surface 312b-S3 of the third ground pattern 312b to be merged therewith at a third merge point MP3. A distance, in the first direction, between the first corner 314-C1 of the third dummy pattern 314 and the third merge point MP3 may be the third length L3. The fourth portion 314-2 may extend, in the second direction (Y direction), away from the first corner 314-C1 of the third dummy pattern 314 by a fourth length L4. As the second side surface 314-S2 of the fourth portion 314-2 extends away from the first corner 314-C1 of the third dummy pattern 314 in the second direction (Y direction), the second side surface 314-S2 of the fourth portion 314-2 is closer to the first side surface 312b-S1 of the third ground pattern 312b to be merged therewith at a fourth merge point MP4. A distance, in the second direction, between the first corner 312-C1 of the third dummy pattern 314 and the fourth merge point MP4 may be the second length L4. For example, the third and fourth lengths L3 and L4 may be the same as or different from each other. In an embodiment, the third and fourth lengths L3 and L4 may have the same value from 1.4 mm to 2.9 mm. A width W3 of the third portion (a width in Y direction) may gradually increase toward the first corner 314-C1 of the third dummy pattern 314, and beyond the first corner 312b-C1 of the third ground pattern 312b, may gradually decrease toward the first corner 314-C1 of the third dummy pattern 314. A width W4 of the fourth portion (a width in X direction) may gradually increase toward the first corner 314-C1 of the third dummy pattern 314, and beyond the first corner 312b-C1 of the third ground pattern 312b, may gradually decrease toward the first corner 314-C1 of the third dummy pattern 314.

The width W3 of the third portion and the width W4 of the fourth portion may increase linearly or non-linearly toward the first corner 314-C1 of the third dummy pattern 314.

A distance, in the first direction, between the first corner C1 of the redistribution wiring layer 300 and the third merge point MP3 where the first side surface 314-S1 of the third dummy pattern 314 and the third side surface 312b-S3 of the third ground pattern 3122b meet with each other may be a third distance M3. A distance, in the second direction, between the first corner C1 of the redistribution wiring layer 300 and the fourth merge point MP4 where the second side surface 314-S2 of the third dummy pattern 314 and the first side surface 312b-S1 of the third ground pattern 312b meet with each other may be a fourth distance M4. The third and fourth distances M3 and M4 may be the same as or different from each other. For example, the third and fourth distances M3 and M4 may have a value from about 1.5 mm to about 3 mm. In an embodiment, the third and fourth distances M3 and M4 have the same value of about 2 mm.

The third dummy pattern 314 may be spaced apart from the outer surface of the redistribution wiring layer 300. For example, the shortest distance, in the first direction, between the third dummy pattern 314 (i.e., the corner 314-C1 of the third dummy pattern 314) and the first side surface S1 of the redistribution wiring layer 300 may be a third distance D3, and the shortest distance, in the second direction, between the third dummy pattern 314 (i.e., the corner 314-C1 of the third dummy pattern 314) and the third side surface S3 of the redistribution wiring layer 300 may be a fourth distance D4. The third and fourth distances D3 and D4 may have the same as or different from each other. For example, the third and fourth distances D3 and D4 may have a value from about 30

μm to about 90 μm. In an embodiment, the third and fourth distances D3 and D4 have the same value of about 75 μm.

In an embodiment, the second redistribution wiring 322 may have a configuration similar to that of the first redistribution wiring 312. The second redistribution wiring 322 may include a fourth signal pattern and a fourth ground pattern. The second redistribution wiring 322 may further include a fourth power pattern. The fourth ground pattern may include a metal pattern having a plurality of through holes. For example, the metal pattern may include a metal material such as copper (Cu). The through hole may have a cylindrical or polygonal column shape.

The fourth signal pattern, the fourth ground pattern and the fourth power pattern may be arranged in the second wiring region WR2. The fourth dummy pattern 324, which has similar configuration of the third dummy pattern 314, may correspond to an extended corner portion of the fourth ground pattern, and may be disposed in the second outer region PR2 to cover at least a portion of the corner C1 of the redistribution wiring layer 300. Four fourth dummy patterns 324 may extend to cover at least portions of four corner portions adjacent to the four corners C1, C2, C3, and C4 of the redistribution wiring layer 300, respectively. The fourth dummy pattern 324 may be provided integrally with the fourth ground pattern. The fourth dummy pattern 324 may include the same metal material (e.g., copper (Cu)) as the fourth ground pattern. A thickness of the fourth dummy pattern 324 may be the same as a thickness of the fourth ground pattern.

The fourth dummy pattern 324 may have substantially the same or similar dimensions as the third dummy pattern 314. Therefore, descriptions of the fourth dummy pattern will be omitted.

For example, the first to third lower insulation layers may include a polymer layer, a dielectric layer, etc. The first to third redistribution wirings may include aluminum (Al), copper (Cu), tin (Sn), nickel (Ni), gold (Au), platinum (Pt) or an alloy thereof.

Accordingly, the redistribution wiring layer 300 may be provided on the second surface 104 of the core substrate 100 and may include the redistribution wirings electrically connected to the chip pads 210 and the core connection wirings 120, respectively. The redistribution wiring layer 300 may cover the second surface 104 of the core substrate 100 provided in an area outside the semiconductor chip 200. Some of the redistribution wirings 302 may electrically connect the chip pads 210 of the semiconductor chip 200 and the core connection wirings 120 of the core substrate 100. It may be understood that the number, sizes, arrangements, etc. of the lower insulation layers of the redistribution wirings are exemplarily illustrated, and thus, it may not be limited thereto.

In example embodiments, the backside redistribution wiring layer may be disposed on the first surface 102 of the core substrate 100 and may include backside redistribution wirings 352 electrically connected to the core connection wirings 120. The backside redistribution wirings 352 may be provided on the first surface 102 of the core substrate 100 to function as a backside redistribution wiring.

The backside redistribution wirings 352 may be provided on the mold layer 140 and may contact the third metal wrings 126 through the fourth openings, respectively. An upper insulation layer 350 may be provided on the mold layer 140 to expose portions of the backside redistribution wirings 352.

For example, the upper insulation layer 350 may include an insulation material such as epoxy resin (thermoset dielectric material), a photo imagable dielectric (PID) material, an insulation film such as ABF (Ajinomoto Build-up Film), etc.

The third and fourth dummy patterns 314 and 324 may be provided in the front redistribution wiring layer 300 to be arranged in the second outer region PR2, while a metal pattern such as the dummy pattern is not provided in the backside redistribution wiring layer and the backside redistribution wirings 352 may be provided in the backside redistribution wiring layer to be arranged only in the second wiring region WR2.

The backside redistribution layer having the upper insulation layer 350 may include a material having a relatively high coefficient of thermal expansion such as ABF, and the core substrate 100 having the wirings and the front redistribution wiring layer may include a material having a relatively low coefficient of thermal expansion. In an embodiment, the backside redistribution layer may have a higher coefficient of thermal expansion compared to that of the core substrate 100. The dummy patterns 132 and 134, and 314 and 324 which are disposed in the wiring layer of the core substrate 100 and the front redistribution wiring layer 300 under the core substrate 100, respectively, may structurally reinforce the core substrate 100 and the front redistribution wiring layer 300 vulnerable to bending at a high temperature range, thereby preventing warpage thereof, which may occur due to such difference of the coefficient of the thermal expansion between the backside redistribution layer and the core substrate 100 or the backside redistribution layer and the front redistribution wiring layer 300.

In example embodiments, outer connection members 400 may be provided on the package pads (i.e., the exposed portion of the third redistribution wiring 332) on the outer surface of the redistribution wiring layer 300, respectively. For example, the outer connection member 400 may include a solder ball. The solder ball may have a diameter having a value from 300 μm to 500 μm. The semiconductor package 10 may be mounted on a module substrate (not illustrated) via the solder balls to constitute a memory module, for example.

As mentioned above, the semiconductor package 10 as the fan-out panel level package may include the core substrate 100 provided in the region outside the semiconductor chip 200 and the lower redistribution wiring layer 300 covering the second surface 104 of the core substrate 100. The semiconductor package 10 may include the first and second dummy patterns 132 and 134 which are disposed in the first outer region PR1 in which the metal wirings are not formed, and extend toward the corners C1, C2, C3, and C4 of the core substrate 100. The first and second dummy patterns 132 and 134 may partially cover corner portions, adjacent to the corners C1, C2, C3, and C4 of the core substrate 100, of the first outer region PR1 of the core substrate 100. The semiconductor package 10 may include the third and fourth dummy patterns 314 and 324 which are disposed in in the second outer region PR2 in which the redistribution wirings are not formed, and extend toward the corners C1, C2, C3, and C4 of the redistribution wiring layer 300. The third and fourth dummy patterns 314 and 324 may partially cover corner portions, adjacent to the corners C1, C2, C3, and C4 of the redistribution wiring layer 300, of the second outer region PR2 of the redistribution wiring layer 300.

The dummy patterns 132, 134, 314, and 324 which may be adjacent to the corners C1, C2, C3, and C4 in a peripheral region of the semiconductor package 10 may serve as reinforcing patterns to compensate the difference in the coefficient of thermal expansion between the backside redistribution wiring layer and the core substrate 100 or between the backside redistribution wiring layer and the redistribution wiring layer 300, thereby preventing a bending phenomenon in which the corner portions of the core substrate 100 or the corner portions of the redistribution wiring layer 300 are rolled upward in a high temperature range.

Hereinafter, a method of manufacturing the semiconductor package in FIG. 1 will be explained.

Figure 7:
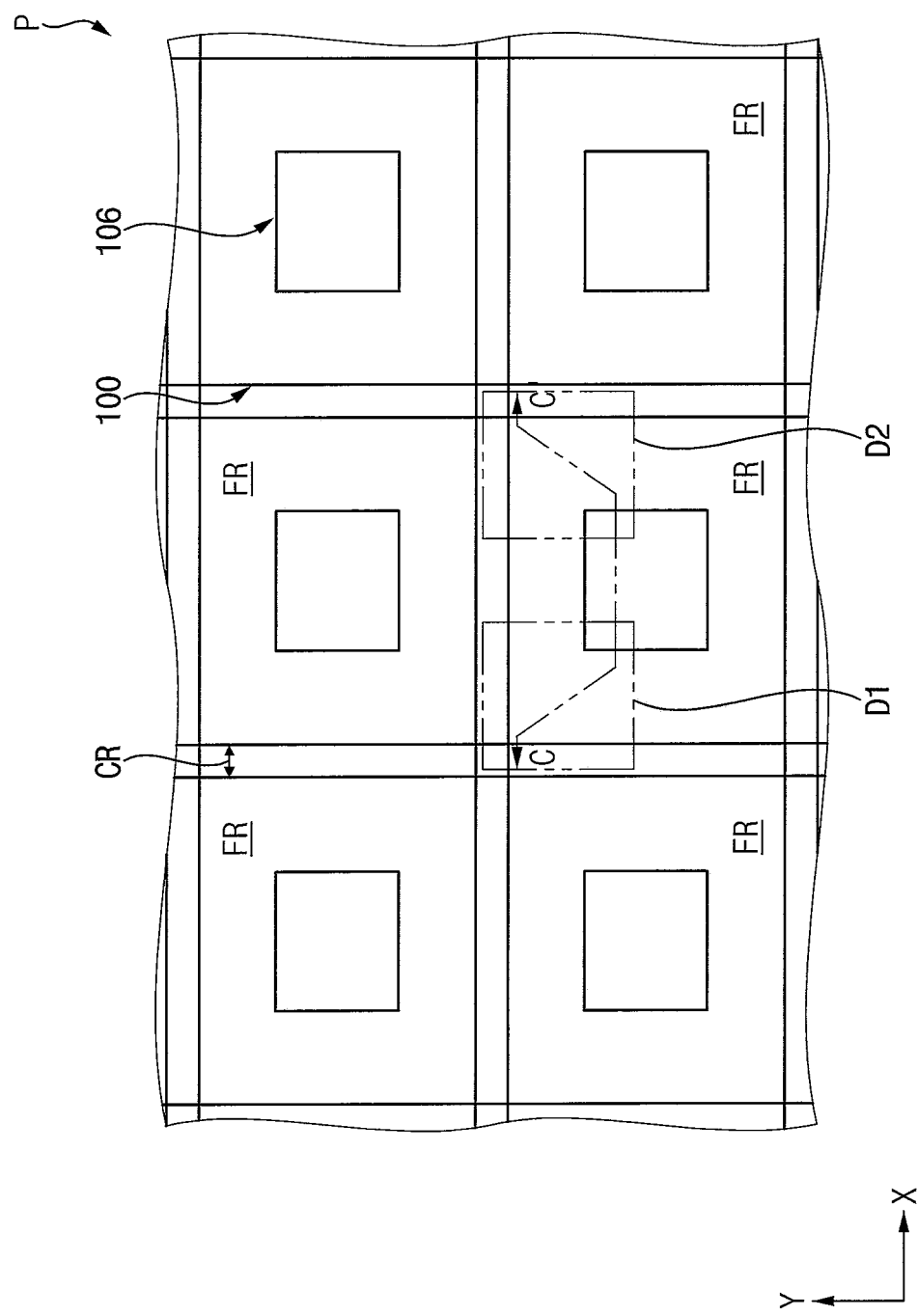

FIGS. 7 to 20 are cross-sectional views illustrating a method of manufacturing a semiconductor package in accordance with example embodiments. FIG. 7 is a plan view illustrating a panel having a plurality of core substrates formed therein. FIGS. 8, 10 to 13 and 15 to 20 are cross-sectional views taken along the line C-C' in FIG. 7. FIG. 9 is a plan view illustrating a portion of a first wiring layer in FIG. 8. FIG. 14 is a plan view illustrating a portion of a first redistribution wiring layer in FIG. 13. FIGS. 9 and 14 are plan views illustrating portion 'D1' in FIG. 7.

Figure 8:
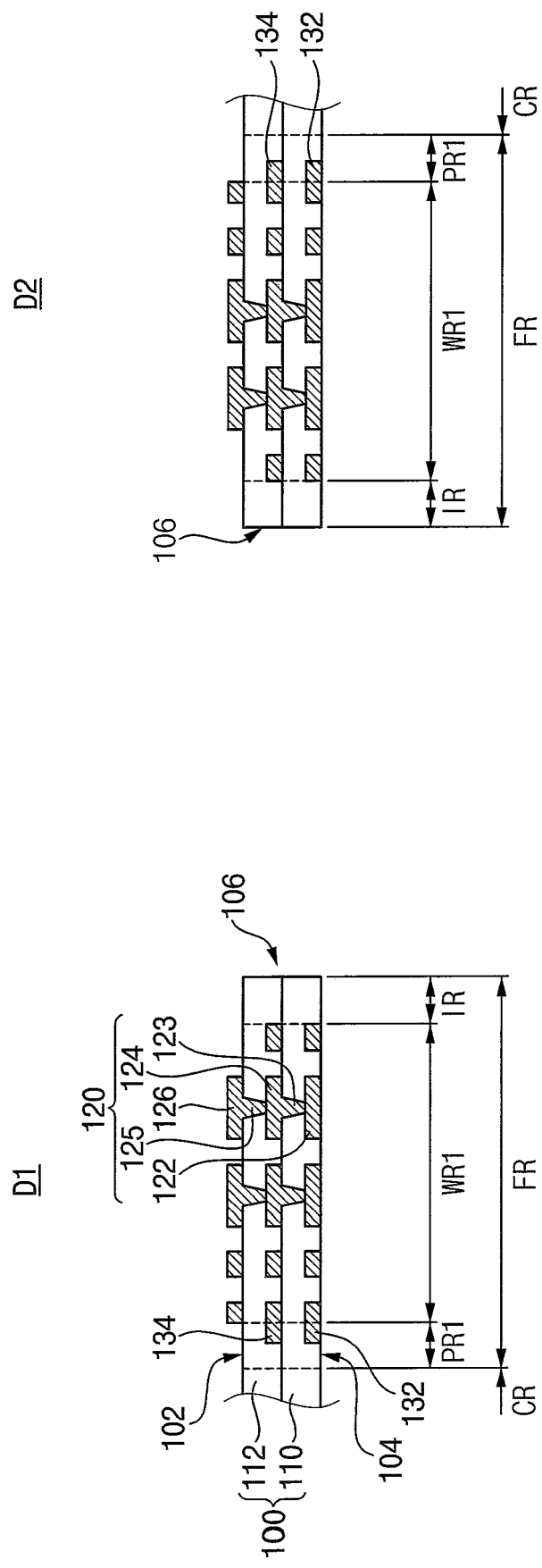
Figure 9:
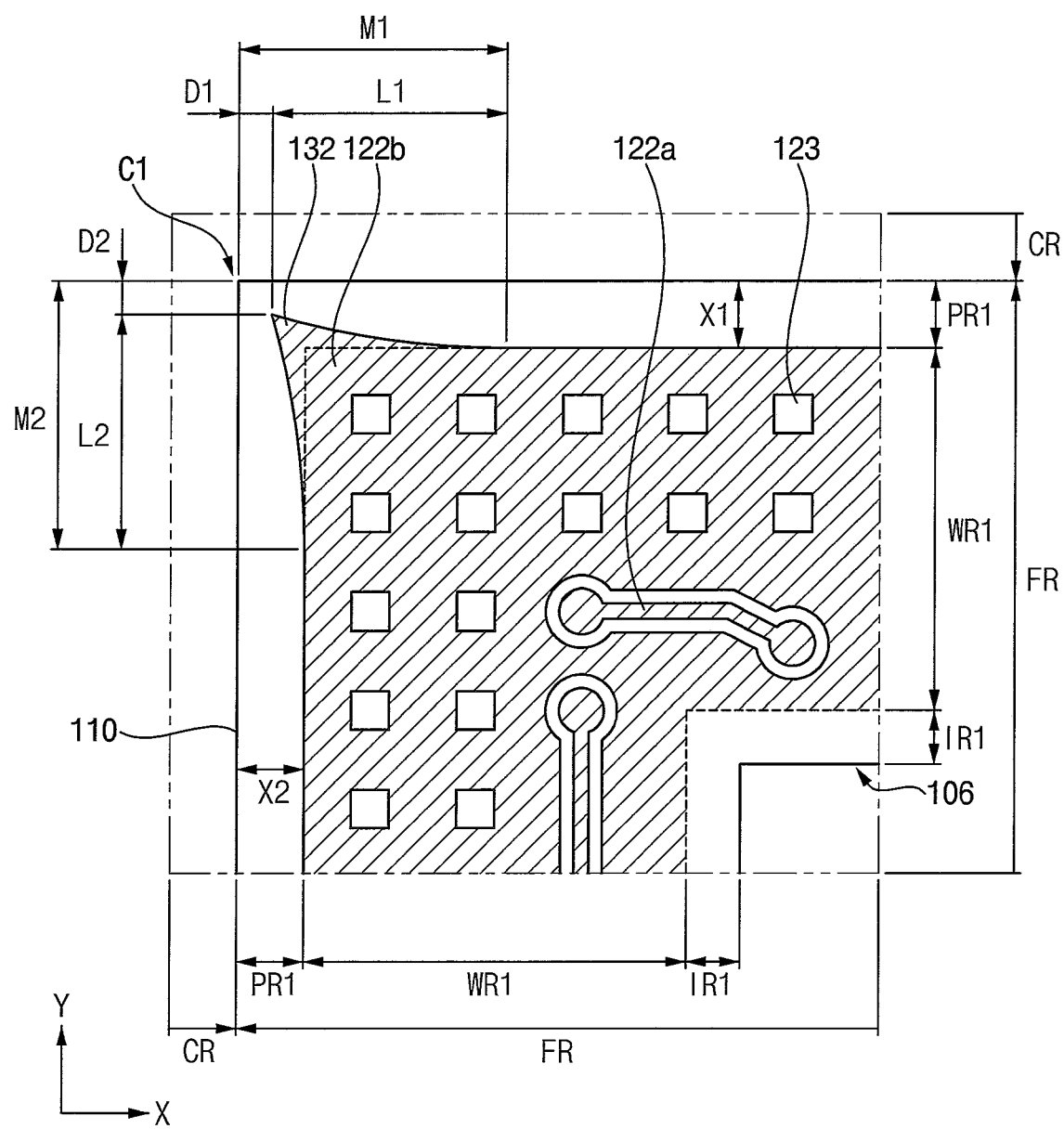

Referring to FIGS. 7 to 9, first, a panel P having a plurality of core substrates 100 formed therein may be prepared.

In example embodiments, the core substrate 100 may be used as a support frame for electrical connection for manufacturing a semiconductor package having a fan-out panel level package configuration. The panel P may include a frame region FR on which the core substrate 100 is formed, and a scribe lane region, that is, cutting region CA surrounding the frame region FR. As described later, the panel P may be sawed along the cutting region CA dividing the frame regions FR to form an individual core substrate 100.

The frame region FR (i.e., the core substrate 100) may include a first wiring region WR1, a first outer region PR1 outside the first wiring region WR1 and a first inner region IR1 inside the first wiring region WR1. The first outer region PR1 may have a first width X1 in a second direction (Y direction) and a second width X2 in a first direction (X direction). In an embodiment, the first outer region PR1 may extend along an outer boundary line of the frame region FR. The outer boundary line of the frame region FR may be an outer boundary line of the first outer region PR1. The first width X1 and the second width X2 may be the same as or different from each other. For example, the first and second widths X1, X2 of the first outer region PR1 may have a value from 100 μm to 200 μm. In an embodiment, the first and second widths X1 and X2 of the first outer region PR1 have the same value of 150 μm.

The core substrate 100 may have a first surface 102 and a second surface 104 opposite to each other. The core substrate 100 may have a cavity 106 in the middle region of the core substrate 100. As described later, the cavity 106 may have an area for receiving at least one semiconductor chip.

The core substrate 100 may include a plurality of stacked insulation layers 110 and 112 and core connection wirings 120 provided in the insulation layers. The core connection wirings 120 may penetrate through the core substrate 100 from the first surface 102 to the second surface 104 of the core substrate 100 to function as an electrical connection path. For example, the core connection wirings 120 may serve as a fan out region outside an area where the semiconductor chip 200 (i.e., a semiconductor die) is disposed, and may be used for electrical connection between the semiconductor chip 200 mounted in the cavity 106 and another semiconductor device which is connected to the core substrate 100.

For example, the core substrate 100 may include a first insulation layer 110 and a second insulation layer 112 stacked on the first insulation layer 110. The core connection wiring 120 may include a first metal wiring 122, a first contact 123, a second metal wiring 124, a second contact 125 and a third metal wiring 126. The first metal wiring 122 may be provided on the second surface 104 of the core substrate 100, which corresponds to a lower surface of the first insulation layer 110. In an embodiment, the first metal wiring 122 may be buried in the first insulation layer 110, and at least a portion of the first metal wiring 122 may be exposed from the second surface 104. The third metal wiring 126 may be provided on the first surface 102 of the core substrate 100, which corresponds to an upper surface of the second insulation layer 112. In an embodiment, the third metal wiring 126 may be disposed on the first surface 102, and may be exposed from the first surface 102. The numbers and arrangements of the insulation layers and the core connection wirings are not limited thereto.

In example embodiments, the core substrate 100 may include at least two stacked wiring layers. The core substrate 100 may include a dummy pattern provided in the at least one wiring layer.

As illustrated in FIGS. 8 and 9, the core substrate 100 may include first to third wiring layers in three levels. The first wiring layer of the core connection wiring 120 may include the first metal wiring 122 arranged in the first wiring region WR1 and a first dummy pattern 132 in the first wiring outer region PR1. The second wiring layer of the core connection wiring 120 may include the second metal wiring 124 arranged in the first wiring region WR1 and a second dummy pattern 134 in the first outer region PR1. The third wiring layer of the core connection wiring 120 may include the third metal wiring 126 arranged in the first wiring region WR1. The first and second dummy patterns 132 and 134 may be formed in the first and second wiring layers of the first to third wiring layers of the core substrate 100, respectively. The first dummy pattern 132 may be formed on the same plane (e.g., the first lower insulating layer 310) as the first metal wiring 122. In an embodiment, the first dummy pattern 132 may be formed in the same level as the first metal wiring 122. The second dummy pattern 134 may be formed on the same plane (e.g., the first insulation layer 110) as the second metal wiring 124. In an embodiment, the second dummy pattern 134 may be formed in the same level as the second metal wiring 124.

As illustrated in FIG. 9, the first metal wiring 122 may include a first signal pattern 122a and a first ground pattern 122b. The first metal wiring 122 may further include a first power pattern (not illustrated). The first ground pattern 122b may include a metal pattern having a plurality of through holes 123H. For example, the metal pattern may include a metal material such as copper (Cu). The through hole may have a cylindrical or polygonal column shape.

The first signal pattern 122a, the first ground pattern 122b and the first power pattern may be arranged in the first wiring region WR1. The first dummy pattern 132 may extend from an outer end portion of the first ground pattern 122b in the first outer region PR1 to cover at least a portion of the core substrate 100, adjacent to a corner C1 of the core substrate 100. Four first dummy patterns 132 may extend to cover at least portions of the core substrate 100 adjacent to four corners C1, C2, C3, and C4 of the core substrate 100, respectively. In an embodiment, the first dummy pattern 132 may be provided with the first ground pattern 122b such that the first dummy pattern 132 may be grounded. For example, the first dummy pattern 132 is an extended corner portion of the first ground pattern 122b, which extends from a first corner 122b-C1 of the first ground pattern 122b toward the first corner C1 of the core substrate 100. The first dummy pattern 132 may include the same metal material (e.g., copper (Cu)) as the first ground pattern 122b. A thickness of the first dummy pattern 132 may be the same as a thickness of the first ground pattern 122b. For example, the thickness of the first dummy pattern 132 may have a value from about 3 μm to about 6 μm.

The first dummy pattern 132 may include a first portion extending in the first direction (X direction) from the first corner C1 of the core substrate 100 and a second portion extending in the second direction (Y direction) from the first corner C1 of the core substrate 100. The first portion may extend, in the first direction (X direction), away from the first corner C1 of the core substrate 100 by a first length L1, and the second portion may extend, in the second direction (Y direction), away from the first corner C1 of the core substrate 100 by a second length L2. The first and second lengths L1 and L2 may be the same as or different from each other. For example, the first and second lengths L1 and L2 may have a value of from about 1.4 mm to about 2.9 mm.

The first dummy pattern 132 may extend from an outer surface of the core substrate 100 by a first distance M1 in the first direction (X direction) and by a second distance M2 in the second direction (Y direction). The first and second distances M1 and M2 may be the same as or different from each other. For example, the first and second distances M1 and M2 may have a value from 1.5 mm to about 3 mm. In an embodiment, the first and second distances M1 and M2 may have the same value of about 2 mm.

The first dummy pattern 132 may be spaced apart from the outer surface of the core substrate 100 by a first distance D1 in the first direction (X direction) and by a second distance D2 in the second direction (Y direction). The first and second distances D1 and D2 may be the same as or different from each other. For example, the first and second distances D1 and D2 may have a value from about 30 μm to about 90 μm. In an embodiment, the first and second distances D1 and D2 have the same value of about 75 μm.

Similarly, the second metal wiring 124 may include a second signal pattern and a second ground pattern. The second metal wiring 124 may further include a second power pattern. The second ground pattern may include a metal pattern having a plurality of through holes. For example, the metal pattern may include a metal material such as copper (Cu). The through hole may have a cylindrical or polygonal column shape.

The second signal pattern, the second ground pattern and the second power pattern may be arranged in the first wiring region WR1. The second dummy pattern 134 may extend from an outer end portion of the second ground pattern in the first outer region PR1 to cover at least a portion of the corner portion adjacent to the corner C1 of the core substrate 100. Four second dummy patterns 134 may extend to cover at least portions of four corner portions adjacent to four corners C1, C2, C3, and C4 of the core substrate 100, respectively. The second dummy pattern 134 may include the same metal material (e.g., copper (Cu)) as the second ground pattern. A thickness of the second dummy pattern 134 may be the same as a thickness of the second ground pattern. For example, the thickness of the second dummy pattern 134 may have a value from about 3 μm to about 6 μm.

The second dummy pattern 134 may have substantially the same or similar dimensions as the first dummy pattern 132. Therefore, descriptions of the second dummy pattern will be omitted.

Figure 10:
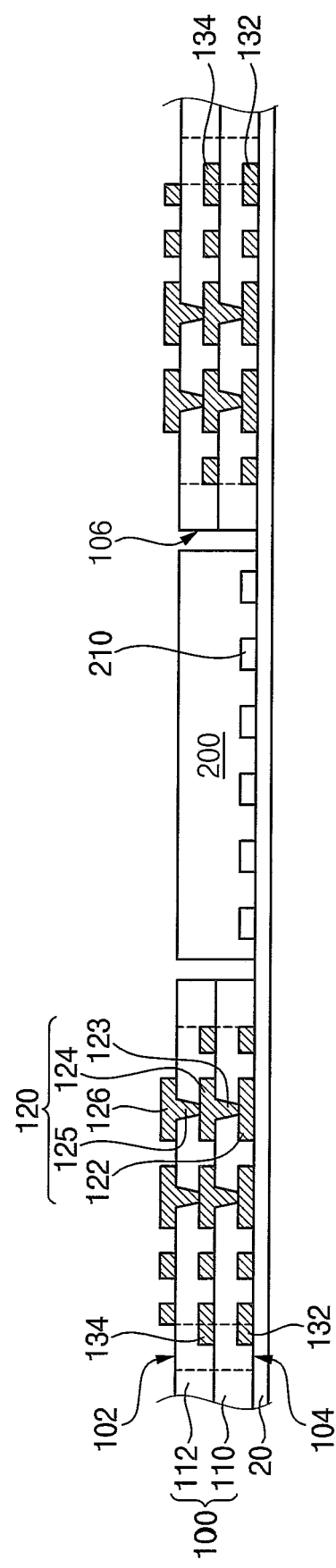
Figure 11:
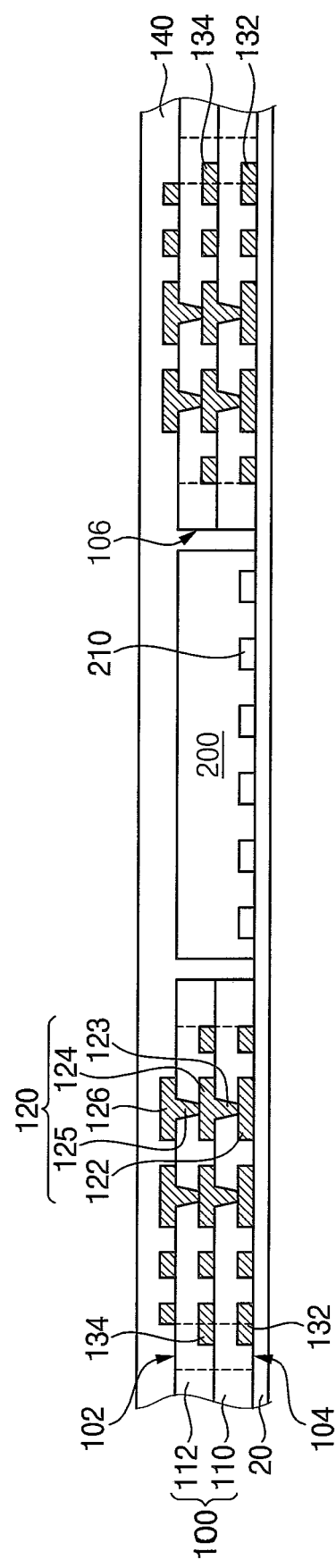

Referring to FIGS. 10 and 11, a semiconductor chip 200 may be arranged within the cavity 106 of the core substrate 100, and then, a mold layer 140 may be formed on the first surface 102 of the core substrate 100 to cover the semiconductor chip 200.

As illustrated in FIG. 10, the panel P may be arranged on a barrier tape 20. The second surface 104 of the core substrate 100 may be adhered on the barrier tape 20. For example, about 200 to about 6,000 dies may be arranged in the cavities 106 of the panel P, respectively. As described later, a singulation process may be performed to saw the panel P to complete a fan-out panel level package. Alternatively, a plurality of semiconductor chips 200 may be arranged within one cavity 106.

The semiconductor chip 200 may include a substrate and chip pads 210 on an active surface, which is a first surface of the substrate. In an embodiment, transistors of the semiconductor chip 200 may be formed in a region adjacent to the active surface of the substrate. The semiconductor chip 200 may be arranged such that the first surface on which the chip pads 210 are formed faces downward. The first surface of the semiconductor chip 200 may be coplanar with the second surface 104 of the core substrate 100.

The semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

As illustrated in FIG. 11, the mold layer 140 may be formed on the first surface 102 of the core substrate 100 to cover the semiconductor chip 200. The mold layer 140 may be formed to fill the gap between the sidewall of the semiconductor chip 200 and the inner sidewall of the cavity 106. Accordingly, the mold layer 140 may cover a second surface opposite to the first surface of the semiconductor chip 200, the first surface 102 of the core substrate 100 and the inner sidewall of the cavity 106.

For example, the mold layer 140 may include an insulation material such as epoxy resin, a photo imagable dielectric (PID) material, an insulation film such as ABF (Ajinomoto Build-up Film), etc.

Referring to FIGS. 12 to 17, a redistribution wiring layer 300 may be formed on the second surface 104 of the core substrate 100 and the first surface of the semiconductor chip 200. The redistribution wiring layer 300 may include redistribution wirings 302 electrically connected to the chip pads 210 of the semiconductor chip 200 and the core connection wirings 120, respectively. The redistribution wiring layer 300 may be a front redistribution wiring layer of a fan out package.

The redistribution wiring layer 300 may include a redistribution region RR and may be divided by the cutting region CA. The redistribution region RR may include a second wiring region WR2 and a second outer region PR2 outside the second wiring region WR2. The second outer region PR2 may have a third width X3 in the second direction (Y direction) and a fourth width X4 in the first direction (X direction). In an embodiment, the second outer region PR2 extends along an outer boundary of the redistribution region RR. The outer boundary line of the redistribution region RR may be an outer boundary line of the second outer region PR2. The third width X3 and the fourth width X4 may be the same as or different from each other. For example, the third and fourth widths X3 and X4 of the second outer region PR2 may have a value from 100 μm to 200 μm. The third and fourth widths X3 and X4 may be the same as or different from each other. In an embodiment, the third and fourth widths X3 and X4 of the second outer region PR2 have a value of 150 μm.

Figure 12:
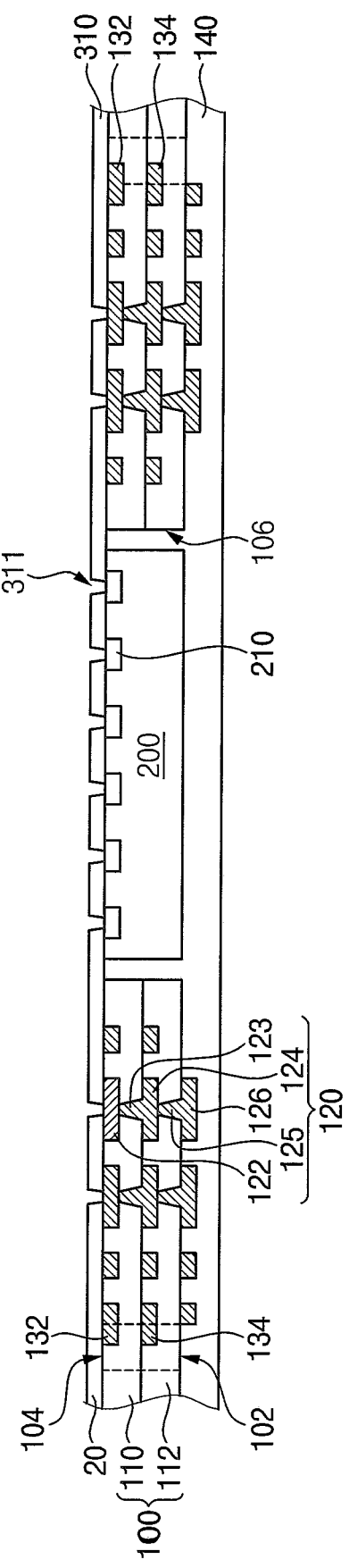

As illustrated in FIG. 12, after removing the barrier tape 20, the structure in FIG. 11 may be reversed, a first lower insulation layer 310 may be formed on the second surface 104 of the core substrate 100, and then, the first lower insulation layer 310 may be patterned to form first openings 311 that expose the chip pads 210 of the semiconductor chip 200 and the first metal wirings 122 of the core connection wiring 120, respectively.

For example, the first lower insulation layer 310 may include a polymer layer, a dielectric layer, etc. The first lower insulation layer 310 may be formed by a vapor deposition process, a spin coating process, etc.

Figure 13:
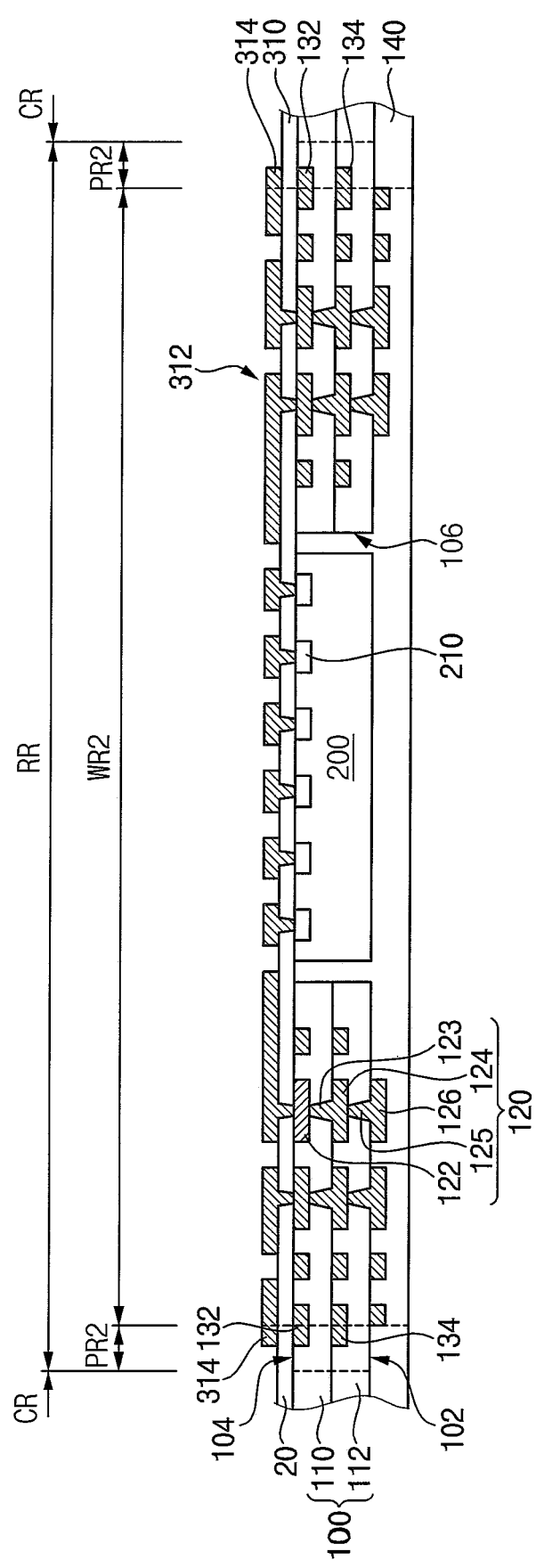
Figure 14:
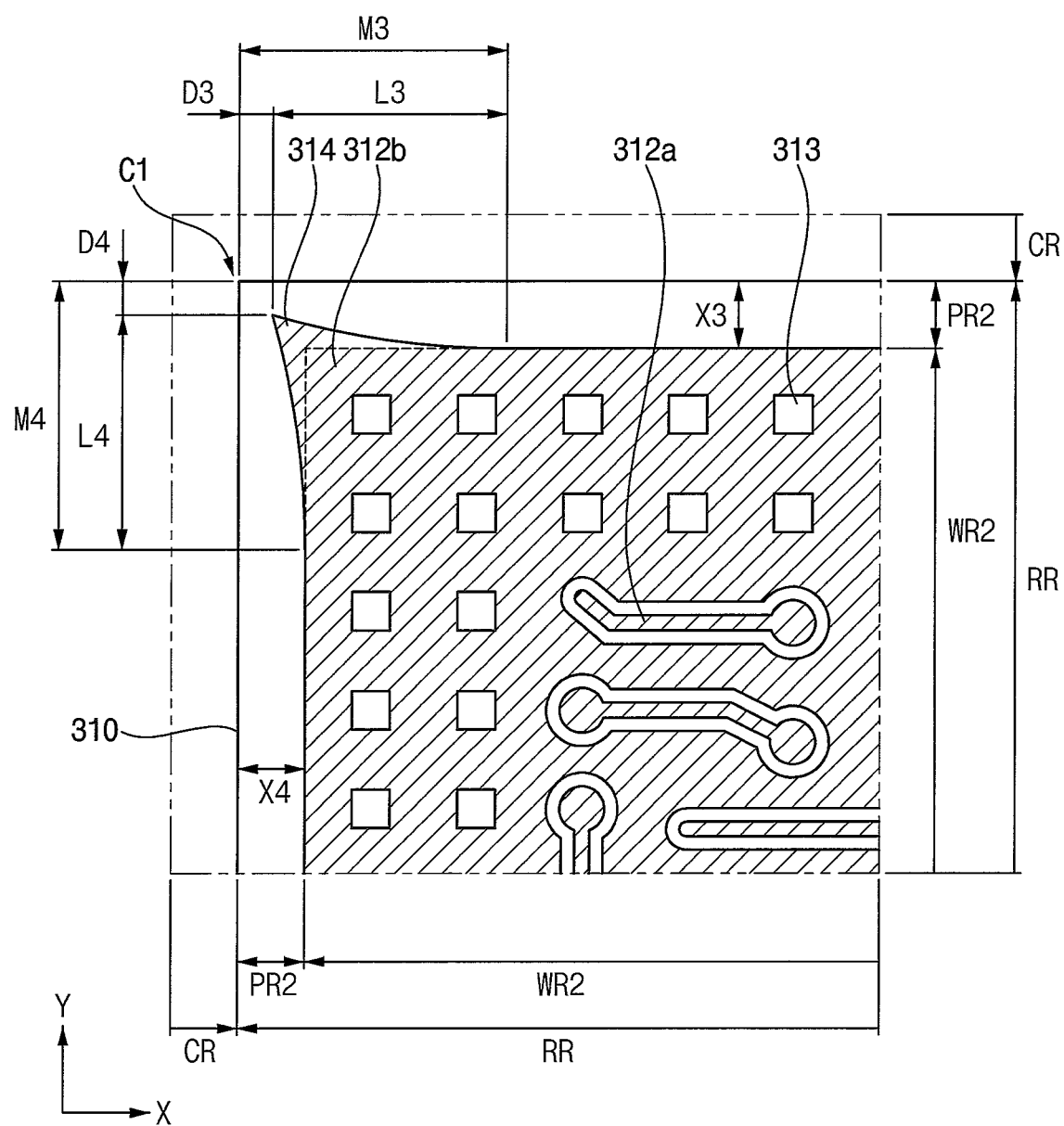

As illustrated in FIGS. 13 and 14, a first redistribution wiring layer may include first redistribution wirings 312 arranged in the second wiring region WR2, and a third dummy pattern 314 arranged in the second outer region PR2. The first redistribution wiring layer may be formed on the first lower insulation layer 310. The first redistribution wirings 312 may contact the chip pads 210 and the first metal wirings 122 through the first openings 311, respectively. The third dummy pattern 314 may be formed on the same plane (e.g., the first lower insulation layer 310) as the first redistribution wiring 312.

In example embodiments, the first redistribution wiring 312 may be formed on portions of the first lower insulation layer 310, the chip pads 210 and the first metal wirings 122. The first redistribution wiring 312 may be formed by forming a seed layer on a portion of the first lower insulation layer 310 and in the first opening, patterning the seed layer and performing an electro plating process. Accordingly, at least portions of the first redistribution wirings 312 may contact the chip pads 210 and the first metal wirings 122 through the first openings. The third dummy pattern 314 may be formed by the same process as the first redistribution wirings 312.

For example, the first redistribution wiring may include aluminum (Al), copper (Cu), tin (Sn), nickel (Ni), gold (Au), platinum (Pt) or an alloy thereof.

As illustrated in FIG. 14, the first redistribution wiring 312 may include a third signal pattern 312a and a third ground pattern 312b. Additionally, the first redistribution wiring 312 may further include a third power pattern (not illustrated). The third ground pattern 312b may include a metal pattern having a plurality of through holes 313. For example, the metal pattern may include a metal material such as copper (Cu). The through hole may have a cylindrical or polygonal column shape.

The third signal pattern 312a, the third ground pattern 312b and the third power pattern may be arranged in the second wiring region WR2. The third dummy pattern 314 may extend from an outer end portion of the third ground pattern 312b in the second outer region PR2 to cover at least a portion of a corner portion adjacent to the corner C1 of the redistribution wiring layer 300. Four third dummy patterns 314 may extend to cover at least portions of four corner portions adjacent to the four corners C1, C2, C3, and C4 of the redistribution wiring layer 300, respectively. The third dummy pattern 314 may include the same metal material (e.g., copper (Cu)) as the third ground pattern 312b. A thickness of the third dummy pattern 314 may be the same as a thickness of the third ground pattern 312b. For example, the thickness of the third dummy pattern 314 may have a value from about 3 μm to about 6 μm.

The third dummy pattern 314 may include a third portion extending, in the first direction (X direction), away from the first corner C1 of the redistribution wiring layer 300, and a fourth portion extending, in the second direction (Y direction), away from the first corner C1 of the redistribution wiring layer 300. The third portion may extend in the first direction (X direction) from the first corner C1 of the redistribution wiring layer 300 by a third length L3, and the fourth portion may extend in the second direction (Y direction) from the first corner C1 of the redistribution wiring layer 300 by a fourth length L4.

The third dummy pattern 314 may extend from an outer surface of the redistribution wiring layer 300 by a third distance M3 in the first direction (X direction) and by a fourth distance M4 in the second direction (Y direction). For example, the third and fourth distances M3 and M4 may have a value from about 1.5 mm to about 3 mm. The third and fourth distances M3 and M4 may be the same as or different from each other. In an embodiment, the third and fourth distances M3 and M4 have a value of about 2 mm.

The third dummy pattern 314 may be spaced apart from the outer surface of the redistribution wiring layer 300 by a third distance D3 in the first direction (X direction) and by a fourth distance D4 in the second direction (Y direction). For example, the third and fourth distances D3 and D4 may have a value from about 30 μm to about 90 μm. The third and fourth distances D3 and D4 may be the same or different from each other. In an embodiment, the third and fourth distances D3 and D4 may have a value of about 75 μm.

Figure 15:
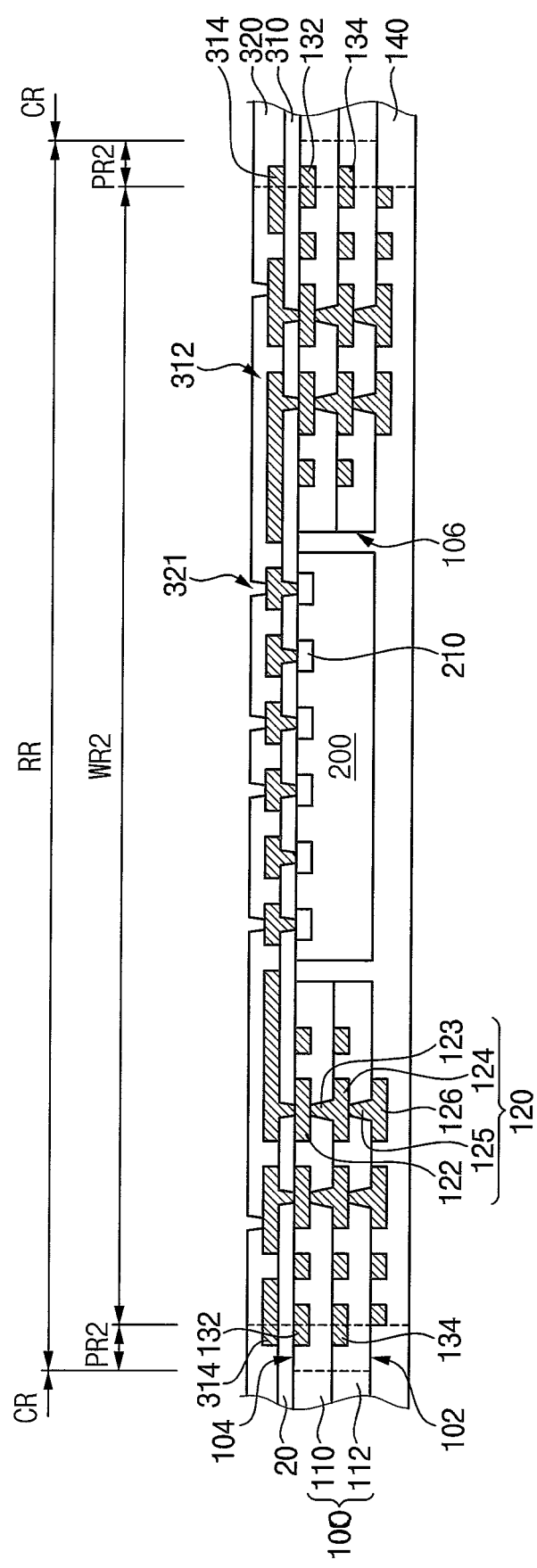
Figure 16:
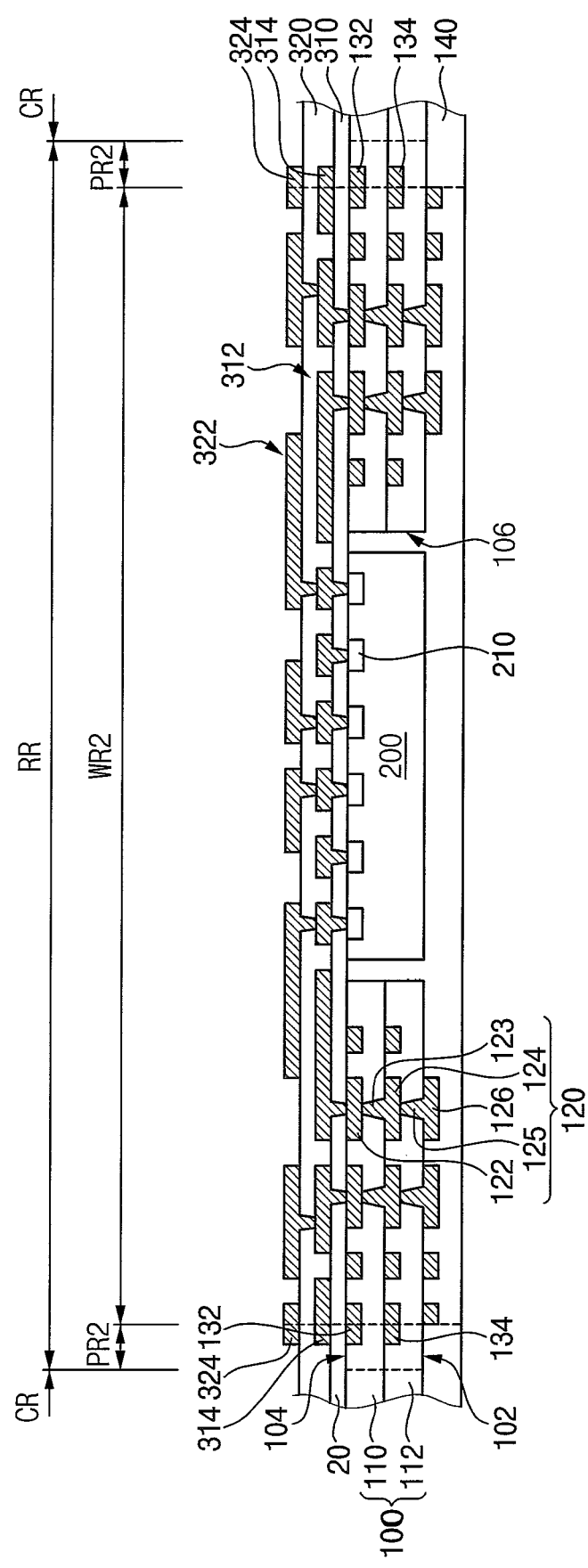

As illustrated in FIGS. 15 and 16, a second lower insulation layer 320 may be formed on the first lower insulation layer 310, and then, the second lower insulation layer 320 may be patterned to form second openings 321 that expose the first redistribution wirings 312, respectively. Then, a second redistribution wiring layer including second redistribution wirings 322 arranged in the second wiring region WR2 and a fourth dummy pattern 324 arranged in the second outer region PR2 may be formed on the second lower insulation layer 320. The second redistribution wirings 322 may contact the first redistribution wirings 312 through the second openings 321, respectively. The fourth dummy pattern 324 may be formed on the same plane as the second redistribution wiring 322.

The second redistribution wiring 322 may include a fourth signal pattern and a fourth ground pattern. The second redistribution wiring 322 may further include a fourth power pattern. The fourth ground pattern may include a metal pattern having a plurality of through holes. For example, the metal pattern may include a metal material such as copper (Cu). The through hole may have a cylindrical or polygonal column shape.

The fourth signal pattern, the fourth ground pattern and the fourth power pattern may be arranged in the second wiring region WR2. The fourth dummy pattern 324 may extend from an outer end portion of the fourth ground pattern in the second outer region PR2 to cover at least a portion of a corner portion adjacent to the corner C1 of the redistribution wiring layer 300. Four fourth dummy patterns 324 may extend to cover at least portions of four corner portions adjacent to the four corners C1, C2, C3, and C4 of the redistribution wiring layer 300, respectively. The fourth dummy pattern 324 may include the same metal material (e.g., copper (Cu)) as the fourth ground pattern. A thickness of the fourth dummy pattern 324 may be the same as a thickness of the fourth ground pattern.

The fourth dummy pattern 324 may have substantially the same or similar dimensions as the third dummy pattern 314. Therefore, descriptions of the fourth dummy pattern will be omitted.

Figure 17:
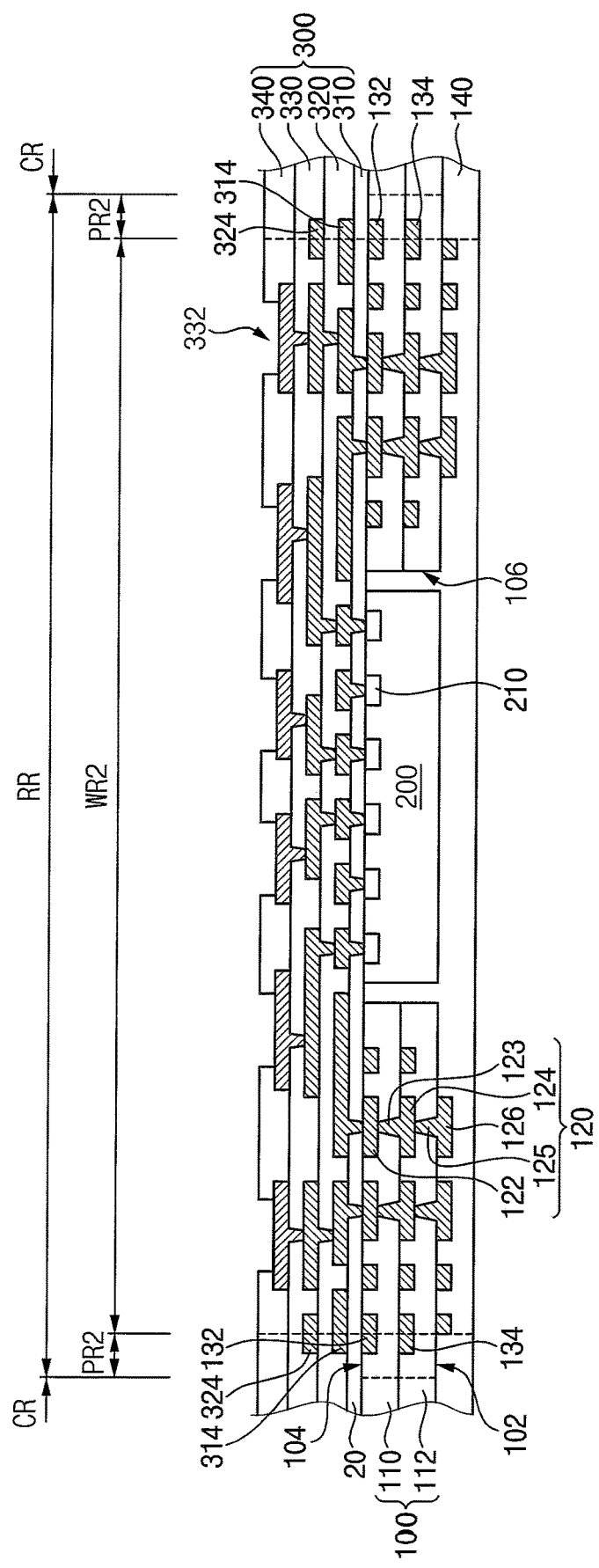

As illustrated in FIG. 17, a third lower insulation layer 330 may be formed on the second lower insulation layer 320, and then, the third lower insulation layer 330 may be patterned to form third openings that expose the second redistribution wirings 322, respectively. Then, a third redistribution wiring layer including third redistribution wirings 332 arranged in the second wiring region WR2 may be formed on the third lower insulation layer 330. Then, a fourth lower insulation layer 340 may be formed on the third lower insulation layer 330 to expose portions of the third redistribution wirings 332.

The fourth lower insulation layer 340 may serve as a passivation layer. A bump pad (not illustrated) such as UBM (Under Bump Metallurgy) may be formed on the portion of the third redistribution wiring 332 exposed by the fourth lower insulation layer 340.

Figure 18:
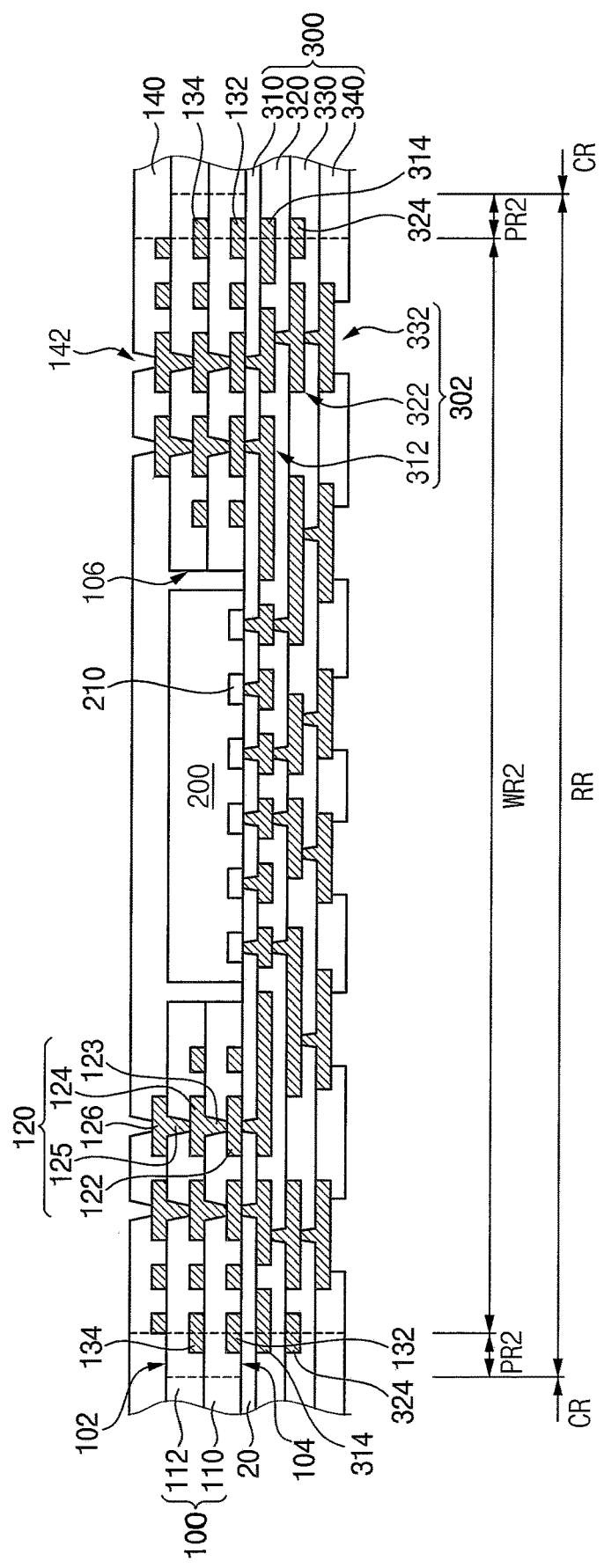
Figure 19:
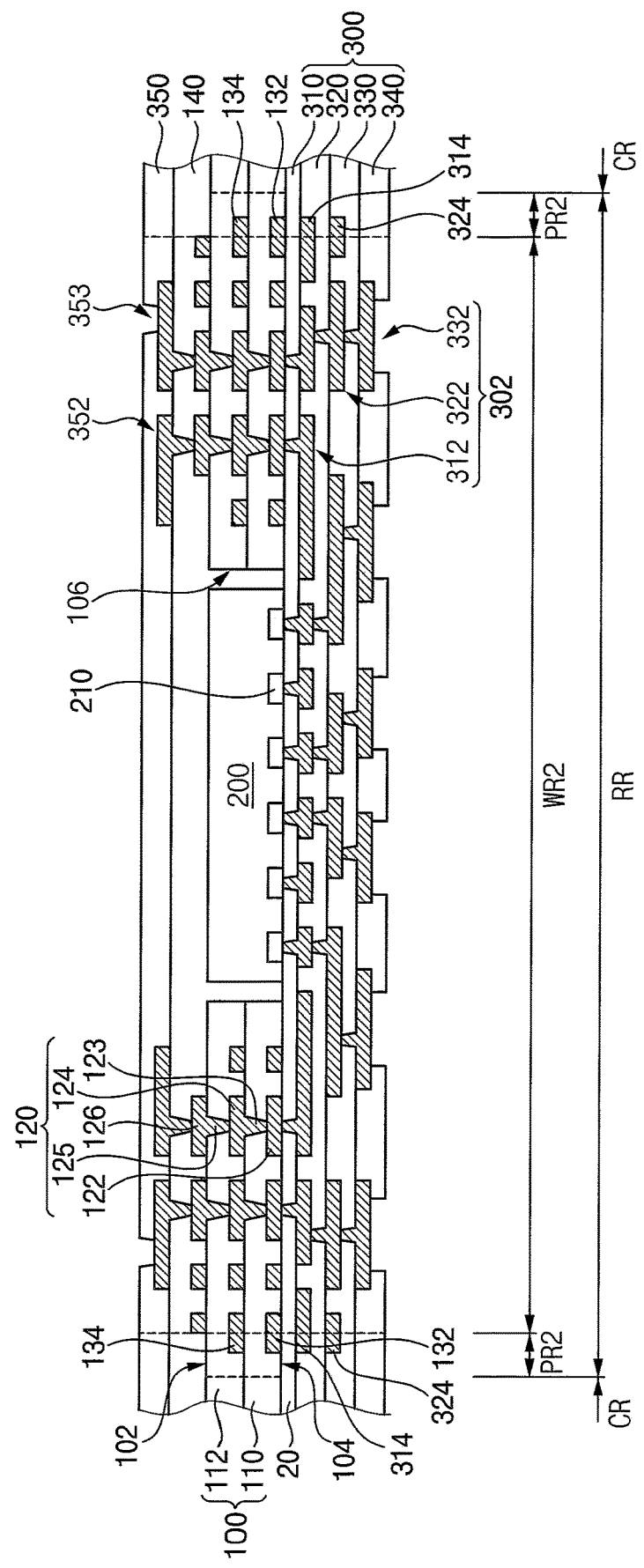

Referring to FIGS. 18 and 19, a backside redistribution wiring layer including backside redistribution wirings 352 electrically connected to the core connection wiring 120 may be formed on the first surface 102 of the core substrate 100.

As illustrated in FIG. 18, the structure in FIG. 17 may be reversed, and then, fourth openings 142 may be formed in the mold layer 140 on the first surface 102 of the core substrate 100 to expos portions of the third metal wirings 126.

As illustrated in FIG. 19, the backside redistribution wirings 352 may be formed on the mold layer 140 to directly contact the third metal wirings 126, respectively. Then, an upper insulation layer 350 may be formed on the mold layer 140 to expose portions of the backside redistribution wirings 352.

For example, the upper insulation layer may include an insulation material such as epoxy resin (thermoset dielectric material), a photo imagable dielectric (PID) material, an insulation film such as ABF (Ajinomoto Build-up Film), etc.

The third and fourth dummy patterns 314 and 324 may be formed in the front redistribution wiring layer 300 to be arranged in the second outer region PR2, while a metal pattern such as the dummy pattern is not formed in the backside redistribution wiring layer and the backside redistribution wirings 352 may be formed in the backside redistribution wiring layer to be arranged only in the second wiring region WR2.

Figure 20:
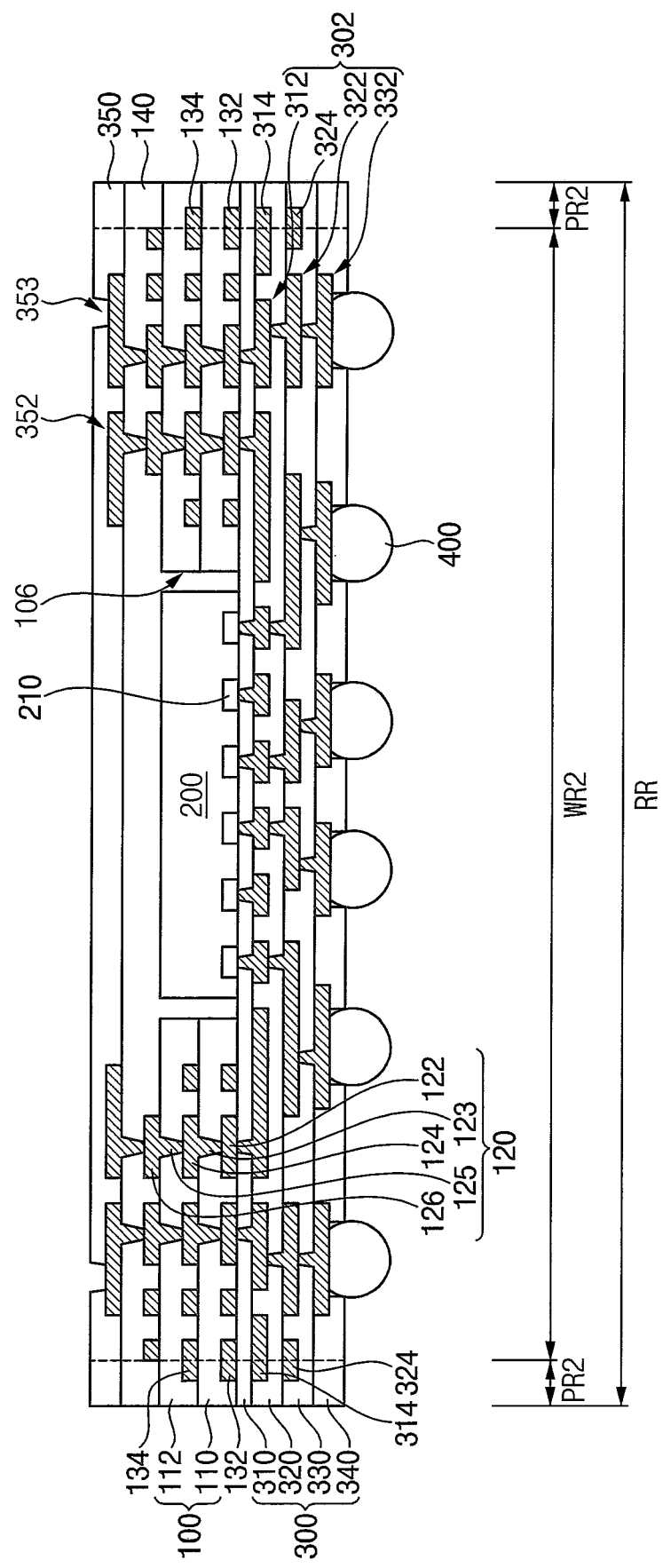

Referring to FIG. 20, outer connection members 400 may be formed on an outer surface of the redistribution wiring layer 300 to be electrically connected to the redistribution wirings 302.

For example, a solder ball as the outer connection member may be disposed on the portion of the third redistribution wiring. In this case, the portion of the third redistribution wiring 332 may serve as a landing pad, which corresponds to a package pad. Thus, semiconductor manufacturing processes may be performed to form the redistribution wiring layer 300 having fan-out type solder ball landing pads.

Then, a sawing process may be performed on the core substrate 100 to form an individual fan-out panel level package including the core substrate 100 and the redistribution wiring layer 300 formed on the lower surface of the core substrate 100.

Figure 21:
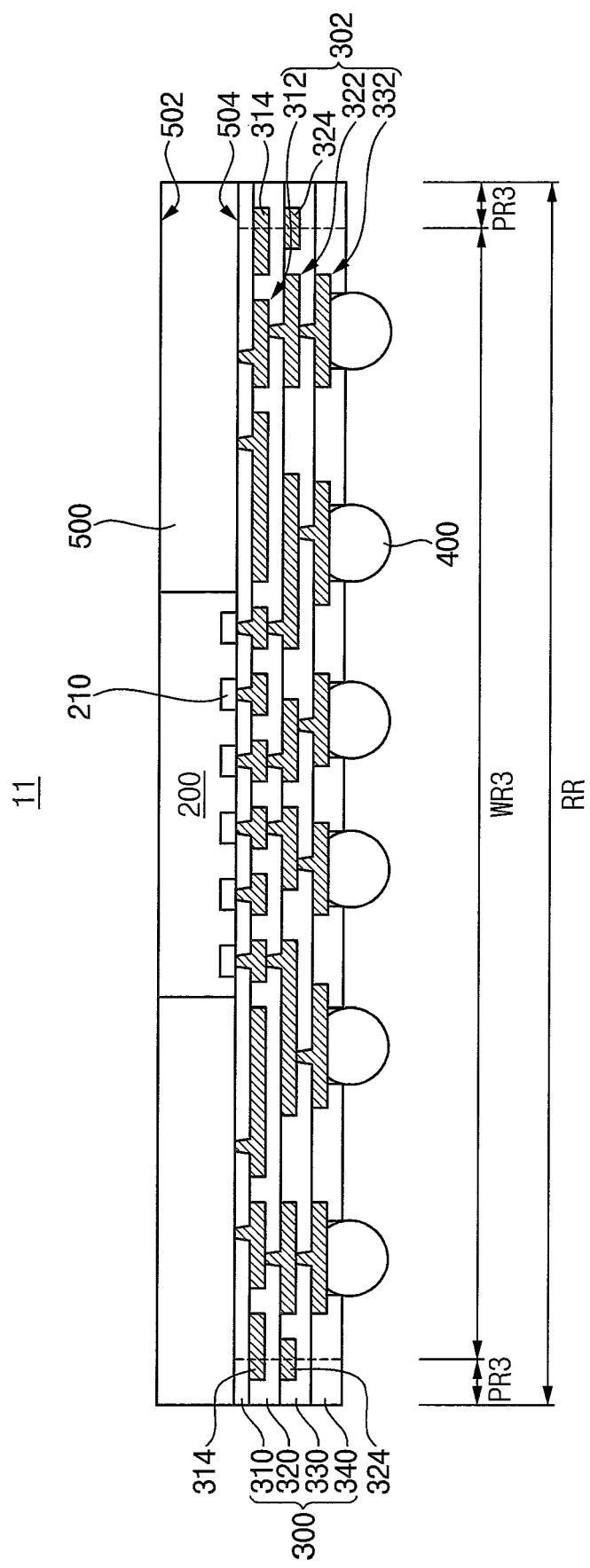
Figure 22:
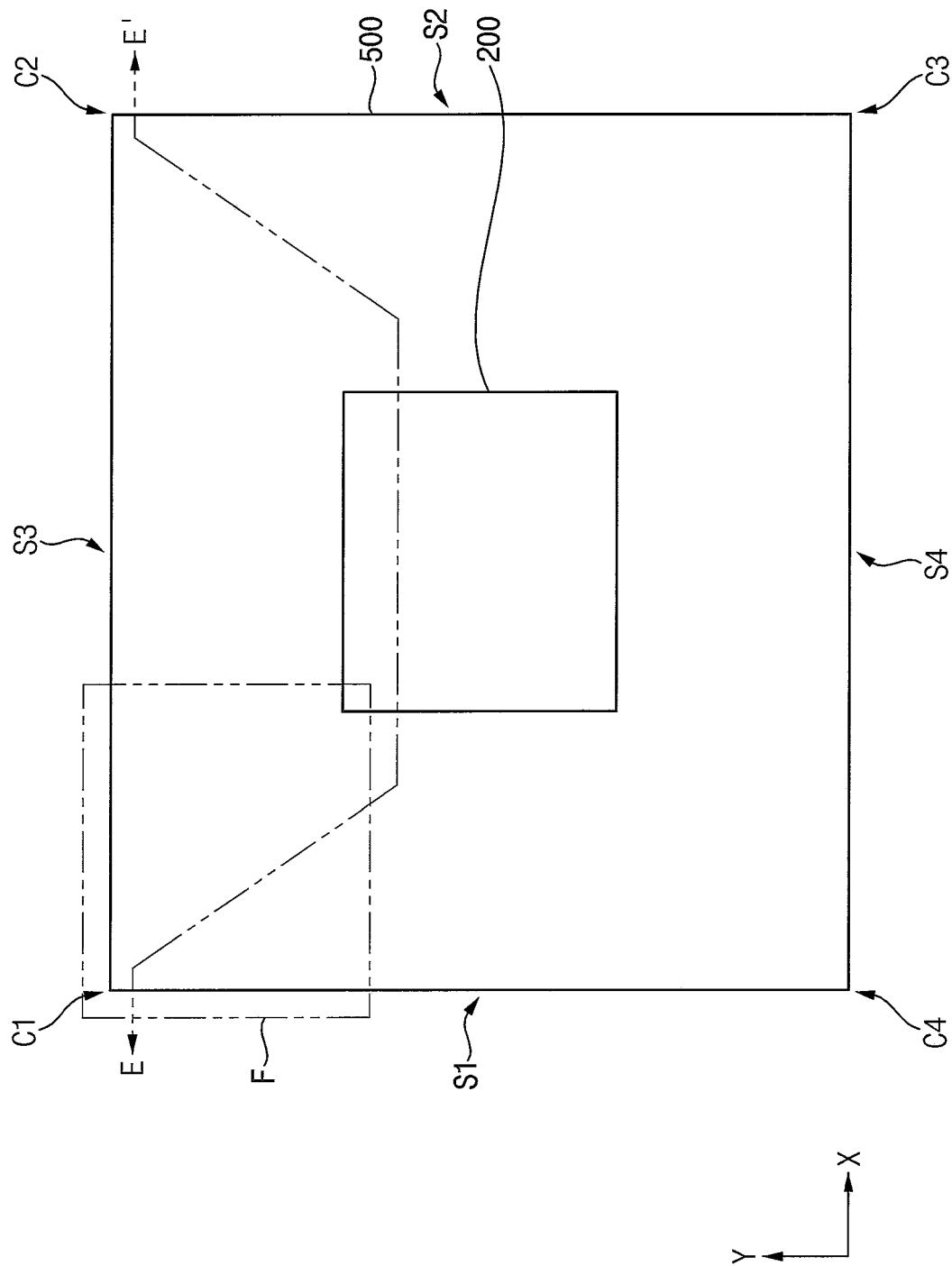
Figure 23:
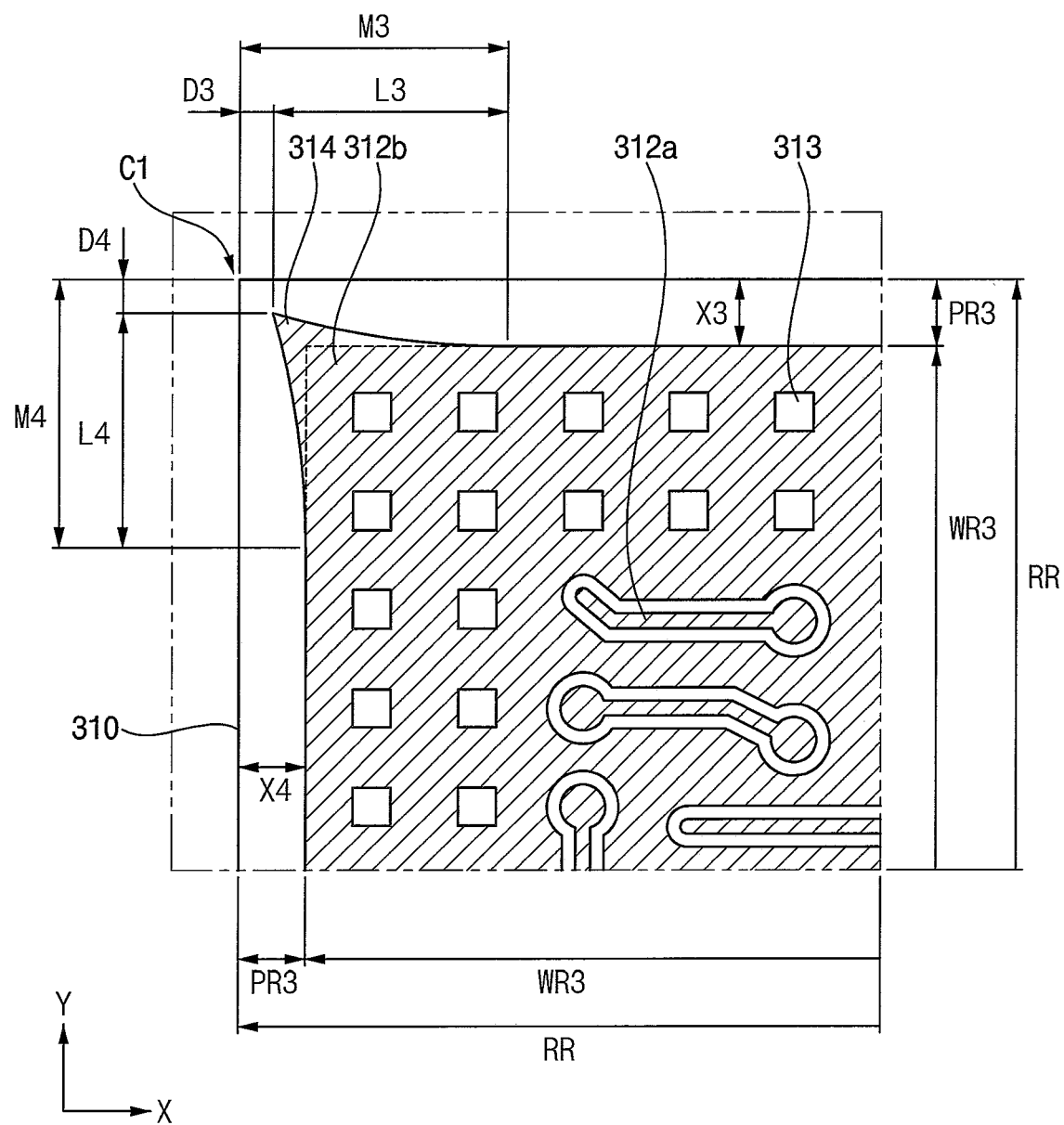

FIG. 21 is a cross-sectional view illustrating a semiconductor package in accordance with example embodiments. FIG. 22 is a plan view illustrating the semiconductor package in FIG. 21. FIG. 23 is a plan view illustrating a portion of a first redistribution wiring layer of a redistribution wiring layer in FIG. 21. FIG. 21 is a cross-sectional view taken along the line E-E' in FIG. 22. FIG. 23 is a plan view illustrating portion 'F' in FIG. 22. The semiconductor package may be substantially the same as or similar to the semiconductor package described with reference to FIG. 1 except for a configuration of a mold substrate provided instead of a core substrate. Thus, the same reference numerals will refer to the same or like elements and any further repetitive explanation concerning the above elements will be omitted.

Referring to FIGS. 21 to 23, a semiconductor package 11 may include a redistribution wiring layer 300, at least one semiconductor chip 200 arranged on the redistribution wiring layer 300 and a mold substrate 500 on an upper surface of the redistribution wiring layer to cover at least one side surface of the semiconductor chip 200. The semiconductor package 11 may further include outer connection members 400 arranged on a lower surface of the redistribution wiring layer 300.

In example embodiments, the semiconductor chip 200 may include a plurality of chip pads 210 on an active surface, which corresponds to a first surface of the semiconductor chip 200. In an embodiment, transistors of the semiconductor chip 200 may be formed in a region adjacent to the active surface of the substrate. The semiconductor chip 200 may be received in the mold substrate 500 such that the first surface on which the chip pads 210 are formed faces the redistribution wiring layer 300. The first surface of the semiconductor chip 200 and a second surface opposite to the first surface may be exposed by the mold substrate 500.

The redistribution wiring layer 300 may be arranged on a lower surface 504 (i.e. a second surface) of the mold substrate 500, and may include redistribution wirings 302 electrically connected to the chip pads 210 of the semiconductor chip 200.

The redistribution wiring layer 300 may include a redistribution region RR. The redistribution region RR may include a third wiring region WR3 and a third outer region PR3 outside the third wiring region WR3.

The redistribution wiring layer 300 may include a first redistribution wiring layer provided on a first lower insulation layer 310 and having first redistribution wirings 312 arranged in the third wiring region WR3 and a third dummy pattern 314 arranged in the third outer region PR3. The third dummy pattern 314 may be on the same plane as the first redistribution wiring 312.

The redistribution wiring layer 300 may include a second redistribution wiring layer provided on a second lower insulation layer 320 and having second redistribution wirings 322 arranged in the third wiring region WR3 and a fourth dummy pattern 324 arranged in the third outer region PR3. The fourth dummy pattern 324 may be on the same plane as the second redistribution wiring 322.

The redistribution wiring layer 300 may include a third redistribution wiring layer provided on a third lower insulation layer 330 and having third redistribution wirings 332 arranged in the third wiring region WR3.

The redistribution wiring layer 300 may include a fourth lower insulation layer 340 provided on the third lower insulation layer 330 to expose portions of the third redistribution wirings 332.

As illustrated in FIG. 23, the first redistribution wiring 312 may include a third signal pattern 312a and a third ground pattern 312b. The first redistribution wiring 312 may further include a third power pattern (not illustrated). The third ground pattern 312b may include a metal pattern having a plurality of through holes 313.

The third signal pattern 312a, the third ground pattern 312b and the third power pattern may be arranged in the third wiring region WR3. The third dummy pattern 314 may extend from an outer end portion of the third ground pattern 312b in the third outer region PR3 to cover at least a portion of a corner portion adjacent to a corner C1 of the redistribution wiring layer 300. Four third dummy patterns 314 may extend to cover at least portions of four corner portions which are adjacent to four corners C1, C2, C3, and C4 of the redistribution wiring layer 300, respectively. The third dummy pattern 314 may include the same metal material (e.g., copper (Cu)) as the third ground pattern 312b. A thickness of the third dummy pattern 314 may be the same as a thickness of the third ground pattern 312b.

The third outer region PR3 may have a third width X3 in the second direction (Y direction), and a fourth width X4 in the first direction (X direction) from the first side surface S1. The third outer region PR3 may extend along an outer boundary of the redistribution region RR (i.e., the third side surface S3 of the semiconductor package 10). The outer boundary line of the redistribution region RR may be an outer boundary line of the third outer region PR3. The third width X3 and the fourth width X4 may be the same as or different from each other. The third and fourth widths X3 and X4 may be the same as or different from each other. For example, the third and fourth widths X3 and X4 of the third outer region PR3 may have a value from 100 μm to 200 μm. In an embodiment, the third and fourth widths X3 and X4 of the third outer region PR3 have the same value of 150 μm.

The third dummy pattern 314 may include a third portion extending, in the first direction (X direction), away from the first corner C1 of the redistribution wiring layer 300, and a fourth portion extending, in the second direction (Y direction), away from the first corner C1 of the redistribution wiring layer 300. The third portion may extend, in the first direction (X direction), away from the first corner C1 of the redistribution wiring layer 300 by a third length L3, and the fourth portion may extend, in the second direction (Y direction), away from the first corner portion C1 of the redistribution wiring layer 300 by a fourth length L4. The third and fourth lengths L3 and L4 may be the same as or different from each other. For example, the third and fourth lengths L3 and L4 may have a value from 1.4 mm to 2.9 mm.

Similarly, the second redistribution wiring 322 may include a fourth signal pattern and a fourth ground pattern. The second redistribution wiring 322 may further include a fourth power pattern. The fourth ground pattern may include a metal pattern having a plurality of through holes. For example, the metal pattern may include a metal material such as copper (Cu). The through hole may have a cylindrical or polygonal column shape.

The fourth signal pattern, the fourth ground pattern and the fourth power pattern may be arranged in the third wiring region WR3. The fourth dummy pattern 324 may extend from an outer end portion of the fourth ground pattern in the third outer region PR3 to cover at least a portion of the corner portion adjacent to the corner C1 of the redistribution wiring layer 300. Four fourth dummy patterns 324 may extend to cover at least portions of four corner portions adjacent to the four corners C1, C2, C3, and C4 of the redistribution wiring layer 300, respectively. The fourth dummy pattern 324 may be provided integrally with the fourth ground pattern. The fourth dummy pattern 324 may include the same metal material (e.g., copper (Cu)) as the fourth ground pattern. A thickness of the fourth dummy pattern 324 may be the same as a thickness of the fourth ground pattern.

The fourth dummy pattern 324 may have substantially the same or similar dimensions as the third dummy pattern 314. Therefore, descriptions of the fourth dummy pattern will be omitted.

Hereinafter, a method of manufacturing the semiconductor package in FIG. 21 will be explained.

Figure 24:
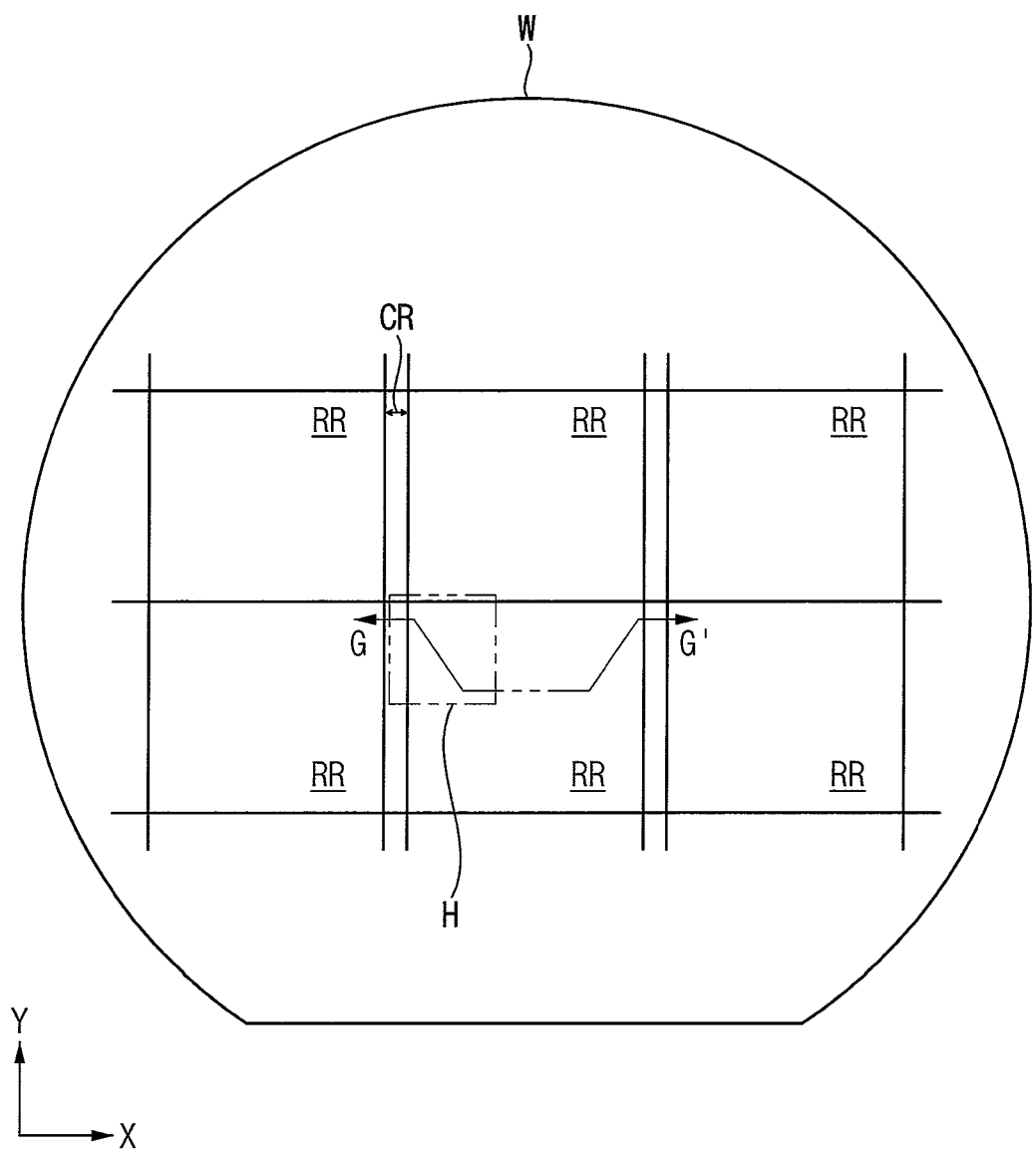
Figure 25:
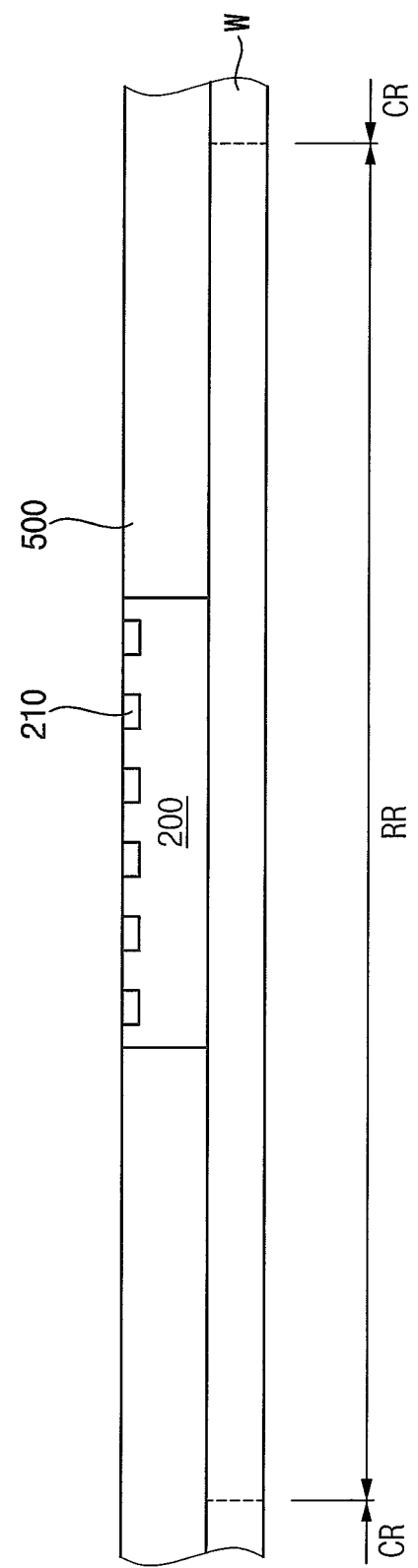
Figure 26:
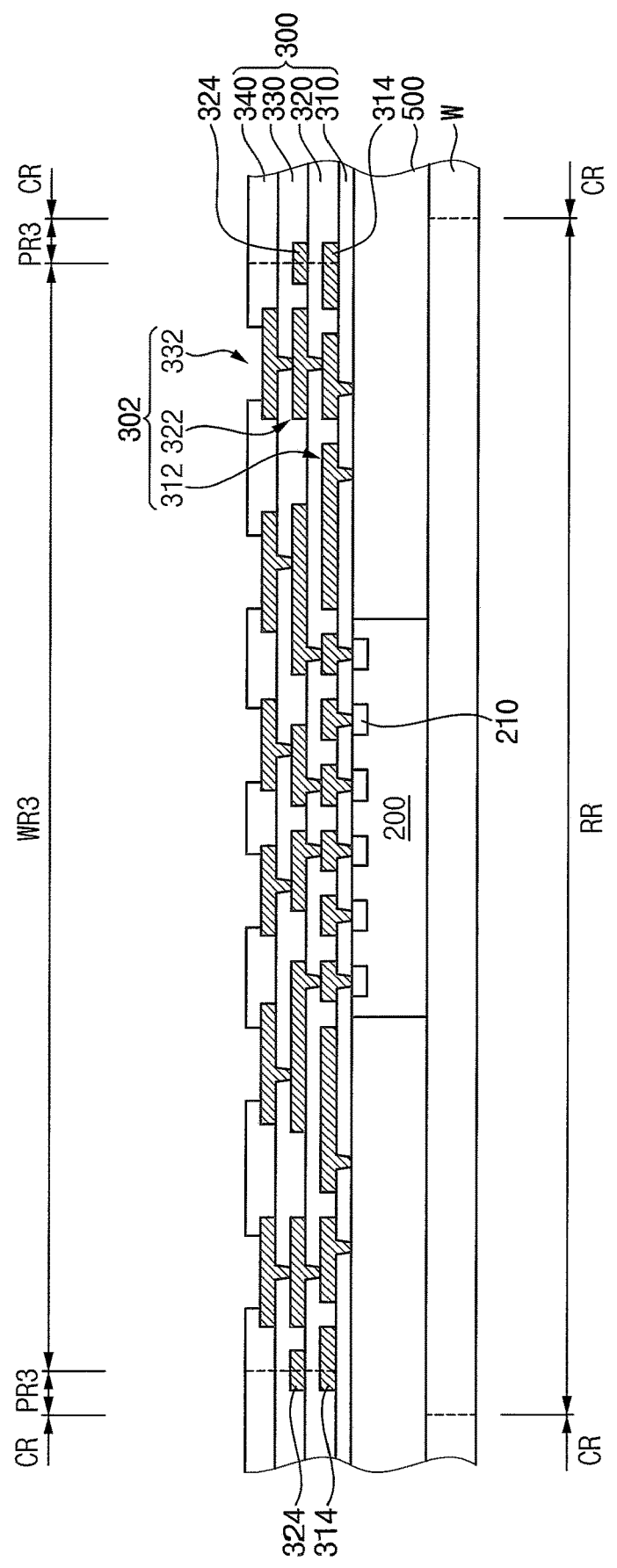
Figure 27:
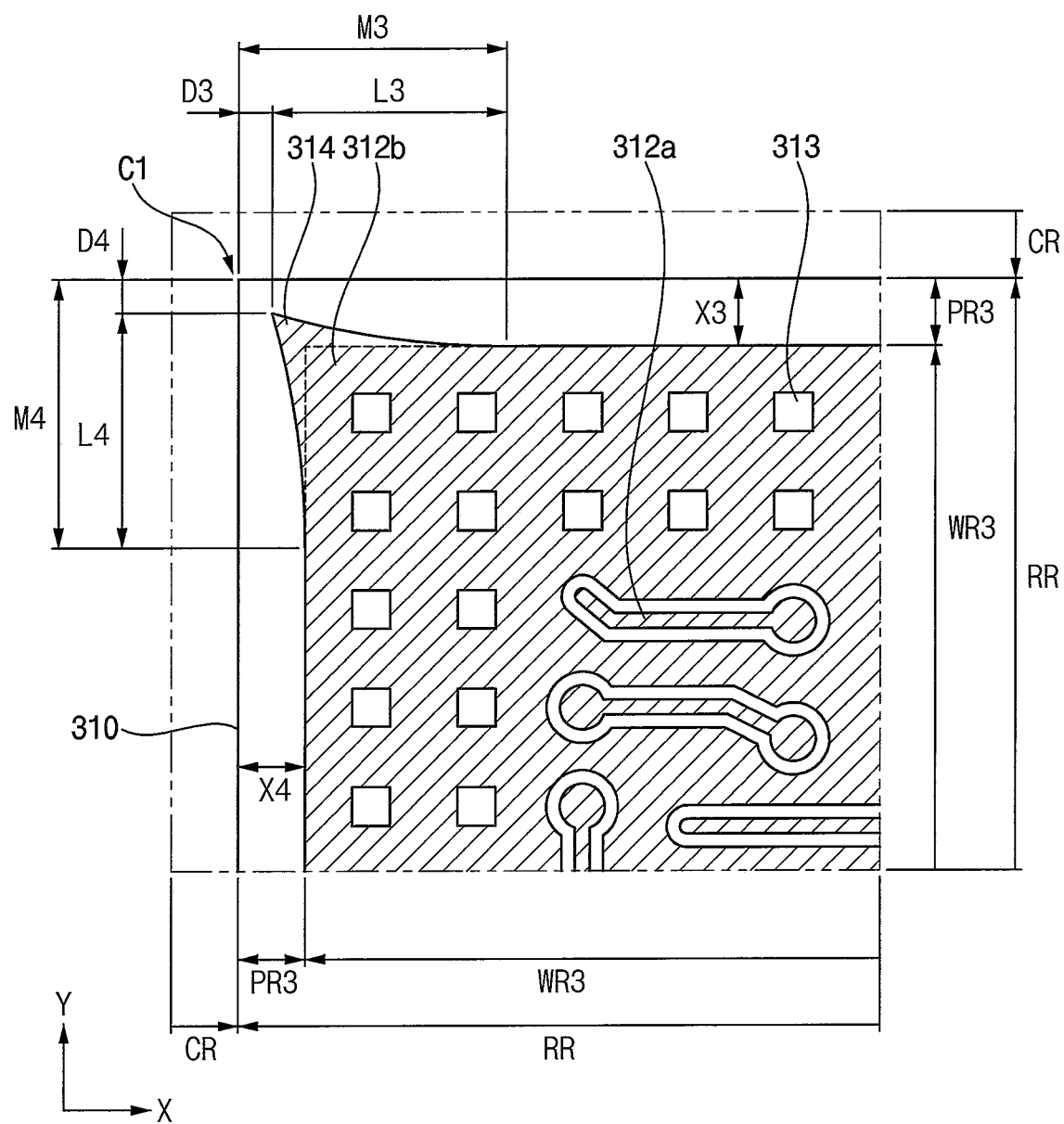
Figure 28:
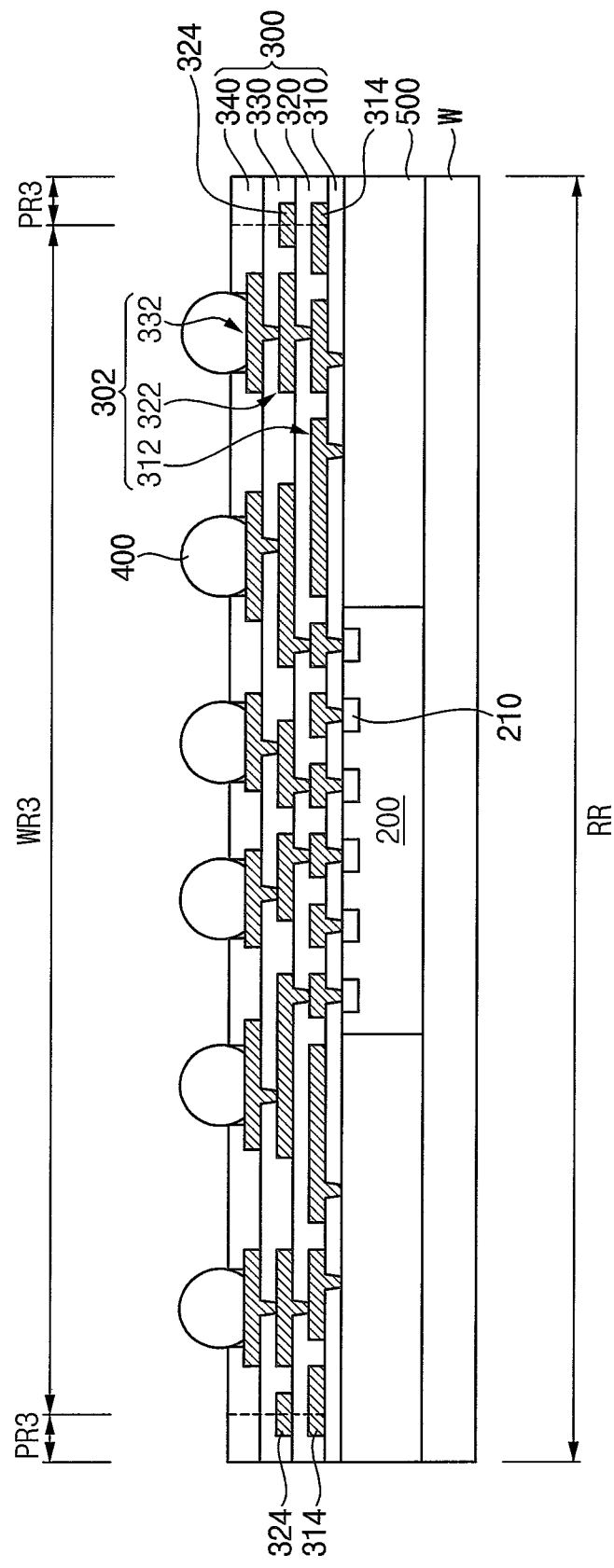

FIGS. 24 to 28 are cross-sectional views illustrating a method of manufacturing a semiconductor package in accordance with example embodiments. FIG. 24 is a plan view illustrating a wafer substrate. FIGS. 25, 26 and 28 are cross-sectional views taken along the line G-G' in FIG. 24. FIG. 27 is a plan view illustrating a portion of a first redistribution wiring layer in FIG. 26. FIG. 27 is a plan view illustrating portion 'H' in FIG. 24.

Referring to FIGS. 24 and 25, after a semiconductor chip 200 is arranged on a wafer substrate W, a mold substrate 500 may be formed on the wafer substrate W to cover the semiconductor chip 200.

In example embodiments, the wafer substrate W may be a base substrate on which a plurality of semiconductor chips 200 are arranged, and the molding substrate 500 is formed to cover the semiconductor chips. The wafer substrate W may have a shape corresponding to a wafer on which a semiconductor fabrication process is performed. The wafer substrate W may include, for example, a silicon substrate, a glass substrate, or a non-metal or metal plate.

The wafer substrate W may include a redistribution region RR on which a redistribution wiring layer is formed, and a cutting region CA surrounding the redistribution region RR. As described later, the redistribution wiring layer and the molding member formed on the wafer substrate W may be sawed along the cutting region CA dividing the redistribution regions RR into individual redistribution regions.

In example embodiments, the semiconductor chip 200 may include a plurality of chip pads 210 on an active surface, which is a first surface of the semiconductor chip 200. In an embodiment, transistors of the semiconductor chip 200 may be formed in a region adjacent to the active surface of the substrate. The semiconductor chip 200 may be arranged on the wafer substrate W such that a second surface opposite to the first surface on which the chip pads 210 are formed faces the wafer substrate W.

Although it is not illustrated in the figures, the semiconductor chip 200 may be attached to the wafer substrate W by a separating layer. The separating layer may include a polymer tape serving as a temporary adhesive. The separating layer may include a material capable of losing adhesion by irradiating light or heating.

In example embodiments, the mold substrate 500 may be formed on the wafer substrate W to cover the semiconductor chip 200. For example, the mold substrate 500 may include epoxy mold compound (EMC). The mold substrate 500 may be formed by a molding process, a screen printing process, a lamination process, etc. The mold substrate 500 may expose the first surface of the semiconductor chip 200 and cover side surfaces of the semiconductor chip 200.

Referring to FIGS. 26 and 27, a redistribution wiring layer 300 may be formed on the mold substrate 500.

In example embodiments, a first lower insulation layer 310 may be formed on the mold substrate 500 and may be patterned to have first openings that expose the chips pads 210 of the semiconductor chip 200. The first lower insulation layer 310 may include a polymer layer, a dielectric layer, etc. For example, the first lower insulating layer may include a photosensitive insulating layer such as photo imagable dielectric (PID). The first lower insulation layer 310 may be formed by a vapor deposition process, a spin coating process, etc.

Then, a first redistribution wiring layer including first redistribution wirings 312 arranged in a third wiring region WR3 and a third dummy pattern 314 arranged in a third outer region PR3 may be formed on the first lower insulation layer 310. The first redistribution wirings 312 may contact the chip pads 210 through the first openings, respectively. The third dummy pattern 314 may be formed on the same plane (e.g., the first lower insulation layer 310) as the first redistribution wiring 312.

The first redistribution wiring 312 may be formed on portions of the first lower insulation layer 310 and the chip pads 210. The first redistribution wiring 312 may be formed by forming a seed layer on a portion of the first lower insulation layer 310 and in the first opening, patterning the seed layer and performing an electro plating process. Accordingly, at least portions of the first redistribution wirings 312 may contact the chip pads 210 through the first openings. The third dummy pattern 314 may be formed by the same process as the first redistribution wirings 312.

For example, the first redistribution wiring may include aluminum (Al), copper (Cu), tin (Sn), nickel (Ni), gold (Au), platinum (Pt) or an alloy thereof.

Then, a second lower insulation layer 320 having second openings that expose the first redistribution wirings 312 may be formed on the first lower insulation layer 310, and a second redistribution wiring layer including second redistribution wirings 322 arranged in the third wiring region WR3 and a fourth dummy pattern 324 arranged in the third outer region PR3 may be formed on the second lower insulation layer 320. The fourth dummy pattern 324 may be formed on the same plane (e.g., the second lower insulation layer 320) as the second redistribution wiring 322. In an embodiment, the fourth dummy pattern 324 may be formed in the same level as the second redistribution wiring 322.

Then, a third lower insulation layer 330 having third openings that expose the second redistribution wirings 322 may be formed on the second lower insulation layer 320, and a third redistribution wiring layer including third redistribution wirings 332 arranged in the third wiring region WR3 may be formed on the third lower insulation layer 330.

Then, a fourth lower insulation layer 340 may be formed on the third lower insulation layer 330 to expose portions of the third redistribution wirings 332. The fourth lower insulation layer 340 may serve as a passivation layer. A bump pad (not illustrated) such as UBM (Under Bump Metallurgy) may be formed on the portion of the third redistribution wiring 332 exposed by the fourth lower insulation layer 340. In this case, the exposed portion of the third redistribution wiring 332 may serve as a landing pad, which corresponds to a package pad.

As illustrated in FIG. 27, the first redistribution wiring 312 may include a third signal pattern 312a and a third ground pattern 312b. The first redistribution wiring 312 may further include a third power pattern (not illustrated). The third ground pattern 312b may include a metal pattern having a plurality of through holes 313. For example, the metal pattern may include a metal material such as copper (Cu). The through hole may have a cylindrical or polygonal column shape.

The third signal pattern 312a, the third ground pattern 312b and the third power pattern may be arranged in the third wiring region WR3. The third dummy pattern 314 may extend from an outer end portion of the third ground pattern 312b in the third outer region PR3 to cover at least a portion of a corner portion adjacent to the corner C1 of the redistribution wiring layer 300. Four third dummy patterns 314 may extend to cover at least portions of four corner portions adjacent to the four corners C1, C2, C3, and C4 of the redistribution wiring layer 300, respectively. The third dummy pattern 314 may include the same metal material (e.g., copper (Cu)) as the third ground pattern 312b. A thickness of the third dummy pattern 314 may be the same as a thickness of the third ground pattern 312b. For example, the thickness of the third dummy pattern 314 may have a value from about 3 μm to about 6 μm.

The third dummy pattern 314 may include a third portion extending, in the first direction (X direction), away from the first corner C1 of the redistribution wiring layer 300 and a fourth portion extending, in the second direction (Y direction), away from the first corner C1 of the redistribution wiring layer 300. The third portion may extend, in the first direction (X direction), away from the first corner C1 of the redistribution wiring layer 300 by a third length L3, and the fourth portion may extend, in the second direction (Y direction), away from the first corner C1 of the redistribution wiring layer 300 by a fourth length L4. The third and fourth lengths L3 and L4 may be the same as or different from each other.

The third dummy pattern 314 may extend from an outer surface of the redistribution wiring layer 300 in the first direction (X direction) by a third distance M3 and in the second direction (Y direction) by a fourth distance M4. The third and fourth distances M3 and M4 may be the same as or different from each other. For example, the third and fourth distances M3 and M4 may have a value from about 1.5 mm to about 3 mm. In an embodiment, the third and fourth distances M3 and M4 may have a value of about 2 mm.

Similarly, the second redistribution wiring 322 may include a fourth signal pattern and a fourth ground pattern. The second redistribution wiring 322 may further include a fourth power pattern. The fourth ground pattern may include a metal pattern having a plurality of through holes. For example, the metal pattern may include a metal material such as copper (Cu). The through hole may have a cylindrical or polygonal column shape.

The fourth signal pattern, the fourth ground pattern and the fourth power pattern may be arranged in the third wiring region WR3. The fourth dummy pattern 324 may extend from an outer end portion of the fourth ground pattern in the third outer region PR3 to cover at least a portion of the corner portion adjacent to the first corner C1 of the redistribution wiring layer 300. Four fourth dummy patterns 324 may extend to cover at least portions of four corner portions adjacent to the four corners C1, C2, C3, and C4 of the redistribution wiring layer 300, respectively. The fourth dummy pattern 324 may be provided integrally with the fourth ground pattern. The fourth dummy pattern 324 may include the same metal material (e.g., copper (Cu)) as the fourth ground pattern. A thickness of the fourth dummy pattern 324 may be the same as a thickness of the fourth ground pattern.

The fourth dummy pattern 324 may have substantially the same or similar dimensions as the third dummy pattern 314. Therefore, descriptions of the fourth dummy pattern will be omitted.

Referring to FIG. 28, outer connection members 400 may be formed on the redistribution wiring layer 300 to be electrically connected to the redistribution wirings 302. For example, a solder ball as the outer connection member 400 may be disposed on the portion of the third redistribution wiring 332. The portion of the third redistribution wiring 332 may serve as a landing pad, which is a package pad which is connected to the outer connection member 400. The outer connection member 400 may be disposed on a region of the redistribution region RR between the dummy patterns 314 and 324, and the semiconductor chip 200 (see, FIG. 1). When the semiconductor package 10 is viewed in a plan view, a portion of the outer connection member 400 may be disposed on a region of the wiring region WR and the semiconductor chip 200.

Thus, semiconductor manufacturing processes may be performed on a region of the wafer substrate W having the same size as each die of a wafer to form the redistribution wiring layer 300 having fan-out type solder ball landing pads.

Then, the redistribution wiring layer 300 and the mold substrate 500 may be cut to form an individual semiconductor package. The redistribution wiring layer 300 may be sawed to be separated by a sawing process to complete a fan out package.

The molding member may be removed by the sawing process such that the second surface of the semiconductor chip 200 is exposed, to form a mold substrate 500. On the other hand, the mold substrate 500 may be formed to cover the side surfaces of the semiconductor chip 200.

Figure 29:
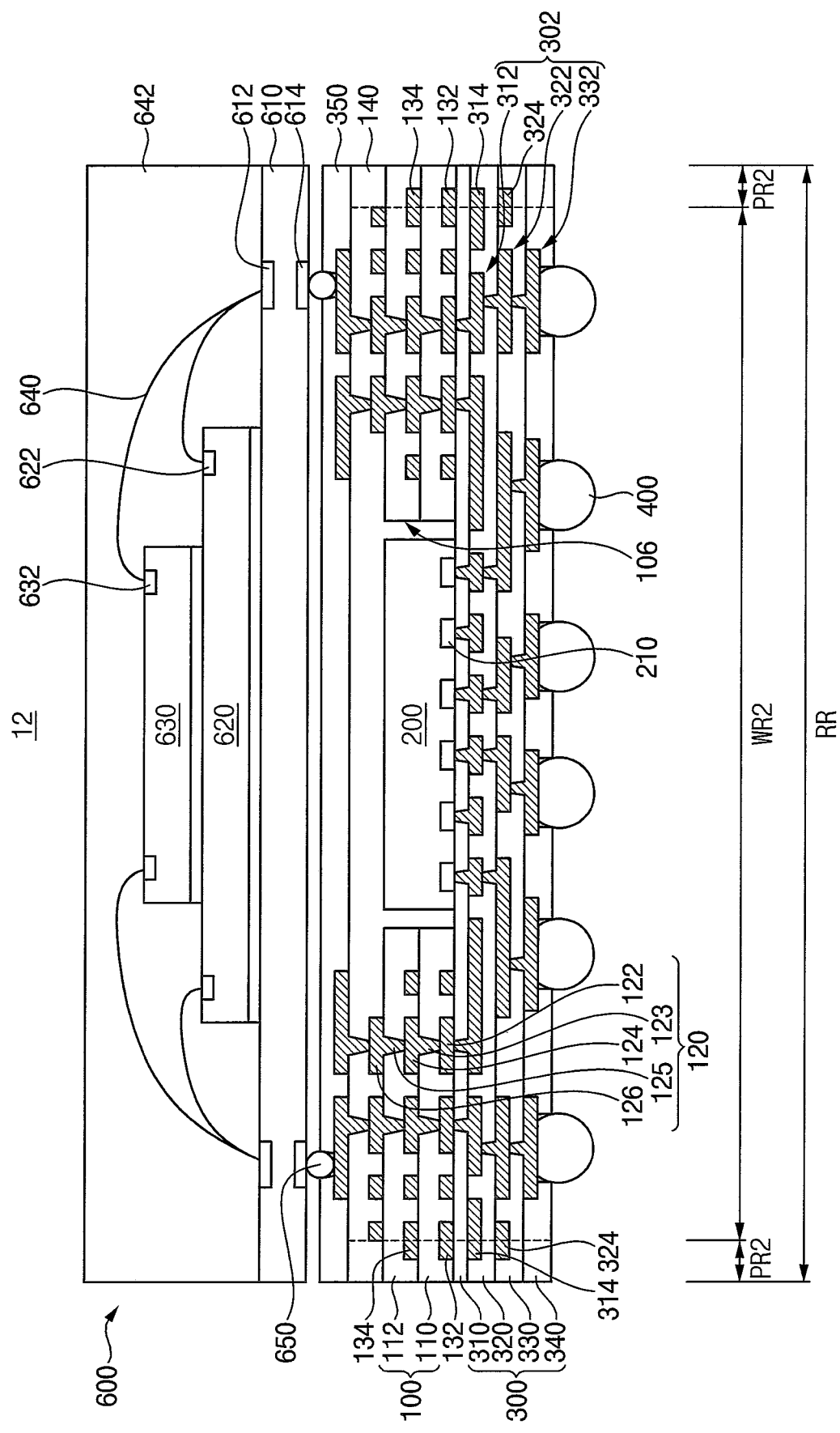

FIG. 29 is a cross-sectional view illustrating a semiconductor package in accordance with example embodiments. The semiconductor package may be substantially the same as or similar to the semiconductor package described with reference to FIG. 1 except for a configuration of an additional second package. Thus, the same reference numerals will refer to the same or like elements and any further repetitive explanation concerning the above elements will be omitted.

Referring to FIG. 29, a semiconductor package 12 may include a first package and a second package 600 stacked on the first package. The first package may include a core substrate 100, a semiconductor chip 200, a lower redistribution wiring layer 300 (i.e., a front side redistribution wiring layer) and an upper redistribution wiring layer (i.e., a backside redistribution wiring layer). The first package may be substantially the same as or similar to the unit package described with reference to FIG. 1.

In example embodiments, the second package 600 may be stacked on the first package via conductive connection members 650.

The second package 600 may include a second package substrate 610, second and third semiconductor chips 620 and 630 mounted on the second package substrate 610, and a molding member 642 on the second package substrate 510 to cover the second and third semiconductor chips 620 and 630.

The second package 600 may be stacked on the first package via the conductive connection members 650. For example, the conductive connection members 650 may include solder balls, conductive bumps, etc. The conductive connection member 650 may be arranged between the backside redistribution wiring 352 of the upper redistribution wiring layer (i.e., the backside redistribution wiring layer) and a second bonding pad 614 of the second package substrate 610. Accordingly, the first package and the second package 600 may be electrically connected to each other by the conductive connection members 650.

The second and third semiconductor chips 620 and 630 may be stacked on the second package substrate 610 by adhesive members. Bonding wires 640 may electrically connect chip pads 622 and 632 of the second and third semiconductor chips 620 and 630 to first bonding pads 612 of the second package substrate 610. The second and third semiconductor chips 620 and 630 may be electrically connected to the second package substrate 610 by bonding wires 640.

Although the second package 600 including two semiconductor chips mounted in a wire bonding manner are illustrated in the figure, the number, the mounting manner, etc. of the semiconductor chips of the second package are not limited thereto.

Figure 30:
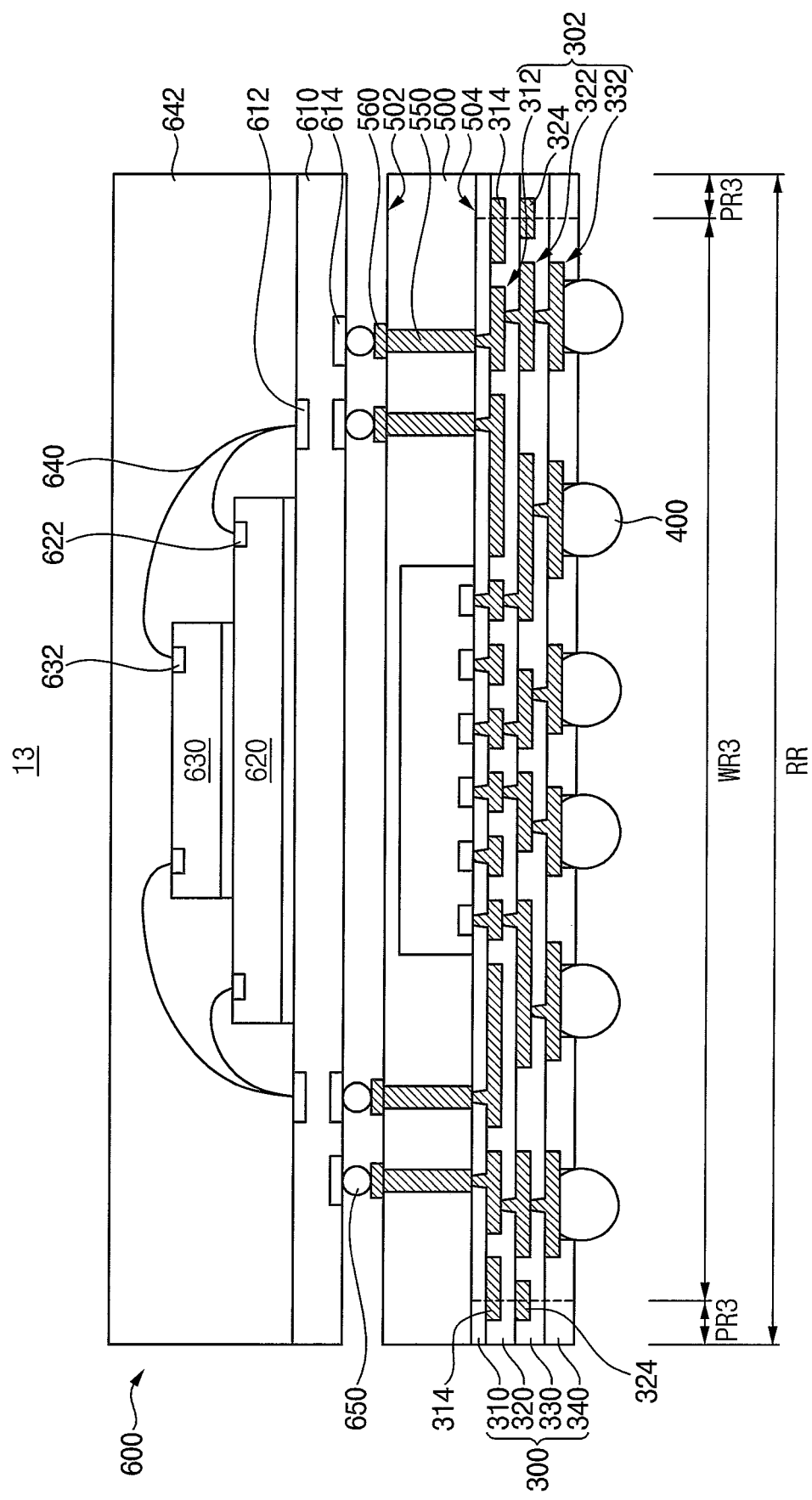

FIG. 30 is a cross-sectional view illustrating a semiconductor package in accordance with example embodiments. The semiconductor package may be substantially the same as or similar to the semiconductor package described with reference to FIG. 21 except for a configuration of an additional second package. Thus, same reference numerals will refer to the same or like elements and any further repetitive explanation concerning the above elements will be omitted.

Referring to FIG. 30, a semiconductor package 13 may include a first package and a second package 600 stacked on the first package. The first package may include a redistribution wiring layer 300, a semiconductor chip 200 arranged on the redistribution wiring layer 300, and a mold substrate 500 on an upper surface of the redistribution wiring layer 300 to cover at least one side surface of the semiconductor chip 200. The first package may be substantially the same as or similar to the unit package described with reference to FIG. 21.

In example embodiments, conductive connection columns 550 may penetrate at least a portion of the mold substrate 500 in a region outside the semiconductor chip 200. The conductive connection column 550 may be a mold through via (MTV) extending from a first surface 502 to a second surface 504 of the mold substrate 500. Additionally, the first package may further include a backside redistribution wiring layer provided on the first surface 502 of the mold substrate 500 and having backside redistribution wirings 560.

The backside redistribution wirings 560 may be provided on upper surfaces of the conductive connection columns 550 exposed from the first surface 502 of the mold substrate 500, respectively. The conductive connection columns 550 may be electrically connected to the backside redistribution wirings 560.

First redistribution wirings 312 of the redistribution wiring layer 300 may be provided on lower surfaces of the conductive connection columns 550 exposed from the second surface 504 of the mold substrate 500, respectively. The conductive connection columns 550 may be electrically connected to the first redistribution wirings 312.

The second package 600 may be stacked on the first surface 502 of the mold substrate 500 via conductive connection members 650. For example, the conductive connection members 650 may include solder balls, conductive bumps, etc. The conductive connection member 650 may be arranged between the backside redistribution wiring 560 on the conductive connection column 550 and a second bonding pad 614 of the second package substrate 610. Accordingly, the first package and the second package 600 may be electrically connected to each other by the conductive connection members 650.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a substrate with a cavity extending from an upper surface of the substrate to a lower surface of the substrate;
at least one semiconductor chip disposed in the cavity of the substrate, and having a plurality of chip pads; and
a redistribution wiring layer disposed on the lower surface of the substrate, and including first and second redistribution wirings and a plurality of dummy patterns, the first and second redistribution wirings being stacked in at least two levels and connected to the plurality of chip pads,
wherein the redistribution wiring layer includes four outer side surfaces,
wherein the first and second redistribution wirings are arranged in a redistribution region of the redistribution wiring layer,
wherein the redistribution region is a region of the redistribution wiring layer defined by four lines which extend parallel to the four outer side surfaces of the redistribution wiring layer to form an outer rectangle of the redistribution region, and
wherein the plurality of dummy patterns are disposed on an outer region of the redistribution wiring layer outside the redistribution region of the redistribution wiring layer to partially cover a plurality of corner portions of the redistribution wiring layer, respectively, and
wherein an outermost boundary of a shape created by the outer rectangle of the redistribution region and the plurality of corner portions forms a shape that is not a rectangle.

2. The semiconductor package of claim 1,
wherein the plurality of dummy patterns are at the same level as at least one of the first and second redistribution wirings.

3. The semiconductor package of claim 1,
wherein at least one of the first and second redistribution wirings includes a ground pattern disposed on the redistribution region of the redistribution wiring layer,
wherein the ground pattern has four side surfaces extending parallel to the four outer side surfaces of the redistribution wiring layer, respectively, and four extended corner portions,
wherein each of the four extended corner portions of the ground pattern is connected to corresponding two side surfaces of the four side surfaces of the ground pattern, and extends from a first corner formed at an intersection of the corresponding two side surfaces of the four side surfaces of the ground pattern, and
wherein each of the four extended corner portions of the ground pattern is a corresponding pattern of the plurality of dummy patterns.

4. The semiconductor package of claim 3,
wherein the plurality of dummy patterns are provided integrally with the ground pattern.

5. The semiconductor package of claim 3,
wherein the plurality of dummy patterns include first to fourth dummy patterns adjacent to four corners of the redistribution wiring layer, respectively,
wherein the first dummy pattern includes a first dummy pattern side surface, a second dummy pattern side surface, and a first dummy pattern corner at an intersection of the first dummy pattern side surface and the second dummy pattern side surface,
wherein the first dummy pattern includes a first portion defined by the first dummy pattern side surface, a first side surface of the ground pattern, and a first line extending from the first corner of the ground pattern to the first dummy pattern corner,
wherein the first side surface of the ground pattern and the first dummy pattern side surface meet each other at a first distance, in a first direction parallel to the first side surface of the ground pattern, from the corner of the redistribution wiring layer,
wherein the first dummy pattern further includes a second portion defined by the second dummy pattern side surface, a second side surface of the ground pattern, and the first line extending from the first corner of the ground pattern to the first dummy pattern corner, and
wherein the second side surface of the ground pattern and the second dummy pattern side surface meet each other at a second distance, in a second direction parallel to the second side surface of the ground pattern, from the corner of the redistribution wiring layer.

6. The semiconductor package of claim 5,
wherein the first distance has a value from about 1.5 mm to about 3 mm.

7. The semiconductor package of claim 5,
wherein a width, in the second direction, of the first portion of the first dummy pattern gradually increases from where the first dummy pattern side surface and the first side surface of the ground pattern meet each other to the first corner of the ground pattern, and gradually decreases from the first corner of the ground pattern to the first dummy pattern corner.

8. The semiconductor package of claim 1,
wherein the substrate includes first and second metal wirings and a plurality of second dummy patterns, the first and second metal wirings being stacked in at least two levels and being connected to the first redistribution wiring,
wherein the substrate includes four side surfaces, and the first and second metal wirings which are arranged in a wiring region of the substrate,
wherein the wiring region is a region of the substrate defined by four lines which extend parallel to the four side surfaces of the substrate and are spaced apart from the four side surfaces of the substrate at a predetermined distance, respectively, and
wherein the plurality of second dummy patterns are disposed on an outer region of the substrate outside the wiring region of the substrate to partially cover a plurality of corner portions of the substrate, respectively.

9. The semiconductor package of claim 8,
wherein the plurality of second dummy patterns are at the same level as at least one of the first and second metal wirings.

10. The semiconductor package of claim 8,
wherein at least one of the first and second metal wirings includes a second ground pattern disposed on the wiring region of the substrate,
wherein the second ground pattern has four side surfaces extending parallel to the four side surfaces of the substrate, respectively, and four extended corner portions,
wherein each of the four extended corner portions of the second ground pattern is connected to corresponding two side surfaces of the four side surfaces of the second ground pattern, and extends from a first corner formed at an intersection of the corresponding two side surfaces of the four side surfaces of the second ground pattern toward a corner, adjacent to the first corner of the second ground pattern, of the substrate, and
wherein each of the four extended corner portions of the second ground pattern is a corresponding pattern of the plurality of second dummy patterns.

11. A semiconductor package, comprising:
a redistribution wiring layer including first and second redistribution wirings stacked in at least two levels and a plurality of extension patterns;
at least one semiconductor chip arranged on the redistribution wiring layer, and having a plurality of chip pads electrically connected to the first and second redistribution wirings; and
a mold substrate disposed on an upper surface of the redistribution wiring layer and covering the at least one semiconductor chip,
wherein the redistribution wiring layer includes four outer side surfaces,
wherein the first and second redistribution wirings are arranged in a redistribution region of the redistribution wiring layer,
wherein the redistribution region is a region of the redistribution wiring layer defined by four lines which extend parallel to the four outer side surfaces of the redistribution wiring layer to form a rectangle of the redistribution region, and
wherein the plurality of extension patterns are disposed on an outer region of the redistribution wiring layer outside the redistribution region of the redistribution wiring layer to partially cover a plurality of corner portions of the redistribution wiring layer, respectively.

12. The semiconductor package of claim 11,
wherein at least one of the first and second redistribution wirings includes a ground pattern disposed on the redistribution region of the redistribution wiring layer,
wherein the ground pattern has four side surfaces extending parallel to the four outer side surfaces of the redistribution wiring layer, respectively, and four extended corner portions,
wherein each of the four extended corner portions of the ground pattern is connected to corresponding two side surfaces of the four side surfaces of the ground pattern, and extends from a first corner formed at an intersection of the corresponding two side surfaces of the four side surfaces of the ground pattern toward a corner, adjacent to the first corner of the ground pattern, of the redistribution wiring layer, and
wherein each of the four extended corner portions of the ground pattern is a corresponding pattern of the plurality of extension patterns.

13. The semiconductor package of claim 12, wherein the plurality of extension patterns are provided integrally with the ground pattern.

14. The semiconductor package of claim 12,
wherein the plurality of extension patterns include first to fourth extension patterns adjacent to four corners of the redistribution wiring layer, respectively,
wherein the first extension pattern includes a first extension pattern side surface, a second extension pattern side surface, and a first extension pattern corner at an intersection of the first extension pattern side surface and the second extension pattern side surface,
wherein the first extension pattern includes a first portion defined by the first extension pattern side surface, a first side surface of the ground pattern, and a first line extending from the first corner of the ground pattern to the first extension pattern corner,
wherein the first side surface of the ground pattern and the first extension pattern side surface meet each other at a first distance, in a first direction parallel to the first side surface of the ground pattern, from the corner of the redistribution wiring layer,
wherein the first extension pattern further includes a second portion defined by the second extension pattern side surface, a second side surface of the ground pattern, and the first line extending from the first corner of the ground pattern to the first extension pattern corner, and
wherein the second side surface of the ground pattern and the second extension pattern side surface meet each other at a second distance, in a second direction parallel to the second side surface of the ground pattern, from the corner of the redistribution wiring layer.

15. The semiconductor package of claim 14,
wherein the first distance has a value from about 1.5 mm to about 3 mm.

16. The semiconductor package of claim 14,
wherein a width, in the second direction, of the first portion of the first extension pattern gradually increases from where the first extension pattern side surface and the first side surface of the ground pattern meet each other to the first corner of the ground pattern, and gradually decreases from the first corner of the ground pattern to the first extension pattern corner.

17. The semiconductor package of claim 14,
wherein the first extension pattern corner of the first extension pattern is spaced apart from the corner of the redistribution wiring layer at a distance, in the first direction, having a value from about 30 μm to about 90 μm.

18. The semiconductor package of claim 14,
wherein the outer region of the redistribution wiring layer has a predetermined width, in the second direction, having a value between 100 μm to 200 μm.

19. The semiconductor package of claim 11, further comprising:
a conductive connection column penetrating at least a portion of the mold substrate from an upper surface of the mold substrate to a lower surface of the mold substrate, and electrically connected to the first redistribution wiring; and
a second package stacked on the mold substrate and electrically connected to the conductive connection column.

20. A semiconductor package, comprising:
a substrate with a cavity extending from an upper surface of the substrate to a lower surface of the substrate;
at least one semiconductor chip disposed in the cavity of the substrate, and having a plurality of chip pads;

a redistribution wiring layer disposed on the lower surface of the substrate, and including first and second redistribution wirings and a plurality of dummy patterns, the first and second redistribution wirings being stacked in at least two levels and connected to the plurality of chip pads; and a plurality of outer connection members disposed on an outer surface of the redistribution wiring layer and electrically connected to the first and second redistribution wirings, wherein the redistribution wiring layer includes four outer side surfaces, and the first and second redistribution wirings which are arranged in a redistribution region of the redistribution wiring layer, wherein the redistribution region is a region of the redistribution wiring layer defined by four lines which extend parallel to the four outer side surfaces of the redistribution wiring layer to form a rectangle of the redistribution region, wherein the plurality of dummy patterns are disposed at an outer region of the redistribution wiring layer outside the redistribution region of the redistribution wiring layer to partially cover a plurality of corner portions of the redistribution wiring layer, respectively, and wherein a portion of the plurality of outer connection members is disposed on a first region of the redistribution region, the first region of the redistribution region being between the plurality of dummy patterns and the at least one semiconductor chip.

\* \* \* \* \*